(12) United States Patent
Kataoka et al.

(10) Patent No.: US 6,172,917 B1
(45) Date of Patent: Jan. 9, 2001

(54) SEMICONDUCTOR MEMORY DEVICE AND REGULATOR

(75) Inventors: Tomonori Kataoka, Oonoji; Yoichi Nishida, Fukuoka; Ikuo Fuchigami, Fukuoka; Tomoo Kimura, Fukuoka; Junji Michiyama, Kasuya-gun, all of (JP)

(73) Assignee: Matsushita Electric Industrial Co., Ltd., Osaka (JP)

( * ) Notice: Under 35 U.S.C. 154(b), the term of this patent shall be extended for 0 days.

(21) Appl. No.: 09/309,581

(22) Filed: May 11, 1999

(30) Foreign Application Priority Data

May 12, 1998 (JP) .................................. 10-129283

(51) Int. Cl.[7] ..................................... G11C 7/00
(52) U.S. Cl. ................. 365/189.05; 365/185.22; 365/185.25
(58) Field of Search ................. 365/203, 189.05, 365/218, 185.22, 185.29, 185.25, 241, 189.11

(56) References Cited

U.S. PATENT DOCUMENTS

| | | | |
|---|---|---|---|
| 5,278,794 | * 1/1994 | Tanaka et al. | 365/200 |
| 5,287,317 | * 2/1994 | Kobayashi et al. | 365/218 |
| 5,818,791 | 10/1998 | Tanaka et al. | 365/230.06 |
| 5,889,698 | * 3/1999 | Miwa et al. | 365/185.03 |

OTHER PUBLICATIONS

"A3.3V–Only 16Mb DINOR Flash Memory", 1995 IEEE International Solid-State Circuits Conference.

* cited by examiner

*Primary Examiner*—David Nelms
*Assistant Examiner*—Thong Le
(74) *Attorney, Agent, or Firm*—Wenderoth, Lind & Ponack, LLP.

(57) ABSTRACT

A semiconductor memory device having nonvolatile memory cells arranged in matrix comprises and bit lines connected to drains of the memory cells. Latches provided for the respective bit lines or in the ratio of one latch to a number of bit lines, as are; transfer gates for electrically separating the respective latches from the bit lines. The device also having bit line voltage detection circuits for detecting voltages of the respective bit lines and latch reset circuits for inverting data stored in the respective latches in accordance with the outputs from the bit line voltage detection circuits. Therefore, data stored in each latch can be rewritten even by a very small memory cell current, resulting in stable program verify.

17 Claims, 19 Drawing Sheets

SEMICONDUCTOR MEMORY DEVICE AND REGULATOR

FIELD OF THE INVENTION

The present invention relates to a nonvolatile semiconductor memory using a flash EEPROM (electrically erasable and programmable read-only memory).

BACKGROUND OF THE INVENTION

In recent years, flash EEPROM has been widely used for various systems in industrial fields and public welfare fields because it has the advantages of being able to electrically erase and program data and being highly resistive to a shock as compared with a hard disk or the like.

To date, memory cells performing programming by CHE (channel hot electron) have been mainly employed. However, with increasing demands for a low voltage and a single power supply to the flash EEPROM, memory cell devices performing programming and erasing by FN (Fowler-Nordheim) tunneling have been developed.

FN tunneling has advantages over CHE in that the programming current is sufficiently low and a single power supply is realized by programming from a booster power supply. However, it requires several msec as a programming time per cell, and this is several tens to several hundreds times as long as the programming time of CHE.

In order to solve this problem, a page programming method is employed, in which a data latch is provided for each bit line to latch one word line of data and, simultaneously, programming and program verify are carried out.

In program verify, it is verified whether programming to the memory cells has been satisfactorily performed or not. If program verify is performed units of word lines, programming is repeated until memory cells for which programming has not been satisfactorily performed complete programming, and this causes a problem relating to reliability, such as drain disturbance.

In order to avoid this problem, there is proposed a method in which data stored in the latches connected to the memory cells for which programming has been completed are rewritten so that further programming is not performed on these memory cells.

Hereinafter, an example of program verify by the conventional flash EEPROM will be described with reference to FIG. 23.

FIG. 23 is a diagram illustrating a column latch circuit included in the above-mentioned DINOR flash EEPROM. In FIG. 23, L1 is a latch for storing data to be programmed. TG is a transfer gate which electrically separates a main bit line MBL0 from the latch L1. P1 and P2 are transistors for precharging the bit line according to the data stored in the latch L1 and a /PC0 signal. SG0 is a select transistor which electrically separates the main bit line MBL0 from a sub bit line SBL0. Likewise, SG1 is a select transistor which electrically separates a main bit line MBL1 from a sub bit line SBL1. MEM0 and MEM1 are memory cells having control gates connected to a word line WL, sources connected to a source line SL, and drains connected to the sub bit lines SBL0 and SBL1. The source line SL is grounded when an ASL signal becomes active. RS1 and RS2 are transistors for resetting the main bit lines, and the main bit lines are grounded by RS0 and RSE.

Next, the operation of the column latch circuit so constructed will be described.

Although the circuit shown in FIG. 23 has two main bit lines MBL0 and MBL1, programming and program verify on the main bit line MBL0 side will be described hereinafter.

Initially, when input data is latched by the latch L1, the supply voltage Vpp of the latch L1 is maintained at Vcc level. After all the data is latched, Vpp is increased to 6V which is the programming voltage of the memory cell. At this time, the selected word line WL is maintained at −8V while the control signal SGL of the select gate SG0 is maintained at 10V. Next, the transfer gate TG becomes active, and the latch L1 and the main bit line MBL0 are electrically connected. When the data held by the latch L1 is "1", 6V is applied to the main bit line MBL0, and when it is "0", 0V is applied to the main bit line MBL0. Since −8V is applied to the control gate of the memory cell MEM0, when 6V is applied to the drain, an electric field occurs in the tunnel oxide film, and electrons stored in the floating gate are drawn to the drain side by an FN current. On the other hand, when the drain is at 0V, programming to the memory cell is not carried out because the electric field does not reach the strength at which a tunnel current occurs.

In program verify, Vpp is at Vcc level, and a voltage of Vcc level is applied to the main bit line MBL0 from the precharging transistors P1 and P2 in accordance with the data stored in the latch L1.

Next, a verify voltage of 1.5V is applied to the word line WL of the memory cell, and the source line SL is grounded by the enable signal ASL. When the threshold voltage of the memory cell is lower than 1.5V, discharging of the main bit line MBL0 is performed through the memory cell and the latch L1 detects it. At this time, the data in the latch L1 is rewritten and further programming is not performed. If the threshold voltage is higher than 1.5V, the initially set data is maintained as it is in the latch L1, and programming is performed until the data in the latch L1 is rewritten.

In the above-described construction, however, since the latched data must be rewritten by lowering the voltage of the main bit line by the memory cell current, stable verify is not achieved.

That is, the transistor of the latch L1 is able to supply a current larger than the sum of the values of the following currents: inter-band tunnel current which occurs between the drain and the substrate during programming, FN tunnel current, and leakage current from non-selected memory cells. However, in program verify, since the voltage of the control gate of the memory cell is a low voltage in the vicinity of the threshold voltage of the programmed memory cell, a sufficient cell current cannot be not secured, resulting in a problem that the latched data cannot be rewritten.

SUMMARY OF THE INVENTION

The present invention is made to solve the above-described problems and it is an object of the present invention to provide a nonvolatile memory device which can reliably rewrite data stored in latches when program verify is performed.

It is another object of the present invention to provide a nonvolatile memory device which can avoid, in program verify, error decision due to leakage current of non-selected memory cells by arbitrarily setting threshold voltages of memory cells and narrowing the distribution of the threshold voltages.

It is still another object of the present invention to provide a nonvolatile memory device which can reduce the programming time and the program verify time.

Other objects and advantages of the invention will become apparent from the detailed description that follows.

The detailed description and specific embodiments described are provided only for illustration since various additions and modifications within the scope of the invention will be apparent to those of skill in the art from the detailed description.

According to a first aspect of the present invention, there is provided a semiconductor memory device having non-volatile memory cells arranged in matrix, and the device comprises: bit lines connected to drains of the memory cells; latches provided for the respective bit lines or in the ratio of one latch to some bit lines; transfer gates for electrically separating the respective latches from the bit lines; bit line voltage detection circuits for detecting voltages of the respective bit lines; and latch reset circuits for inverting data stored in the respective latches in accordance with the outputs from the bit line voltage detection circuits. Therefore, the data stored in the latches can be rewritten even by a slight memory cell current, resulting in a non-volatile memory device performing stable program verify.

According to a second aspect of the present invention, the semiconductor memory device of the first aspect further comprises: means for precharging a bit line which is selected from the bit lines connected to the drains of the memory cells, when performing program verify to decide whether programming to the memory cell has been properly performed or not; means for applying a program verify voltage to a word line of the selected memory cell in the program verify; means for detecting a bit line voltage which is determined by a cell current of the selected memory cell in the program verify; and the latch reset circuit inverting the data stored in each latch in accordance with the output from the bit line voltage detection means. Therefore, the data stored in the latches can be rewritten even by a slight memory cell current, resulting in a nonvolatile memory device performing stable program verify.

According to a third aspect of the present invention, there is provided a semiconductor-memory device having non-volatile memory cells arranged in matrix, and the device comprises: bit lines connected to drains of the memory cells; latches provided for the respective bit lines or in the ratio of one latch to some bit lines; transfer gates for electrically separating the respective latches from the bit lines; level shift circuits for converting the output levels of the latches to a programming voltage and a verify drain voltage; bit line voltage detection circuits for detecting voltages of the respective bit lines; and latch reset circuits for inverting data stored in the respective latches in accordance with the outputs from the bit line voltage detection circuits. Therefore, the data stored in the latches can be rewritten even by a slight memory cell current, resulting in a non-volatile memory device performing stable program verify. Further, since the output (voltage) of each latch is converted by the level shift circuit, a leakage current which flows when the voltage of Vpp varies can be suppressed.

According to a fourth aspect of the present invention, there is provided a semiconductor memory device having nonvolatile memory cells arranged in matrix, and the device comprises: means for precharging a bit line which is selected from bit lines connected to drains of the memory cells, when performing program verify to decide whether programming to the memory cell has been properly performed or not; means for applying a program verify voltage to a word line of the selected memory cell in the program verify; and means for applying a negative voltage to word lines of memory cells which are not selected. In this device, data stored in latches are inverted according to the voltages of the bit lines. Therefore, a leakage current from a non-selected memory cell can be suppressed during program verify, whereby error decision (verify) can be avoided.

According to a fifth aspect of the present invention, there is provided a semiconductor memory device having non-volatile memory cells arranged in matrix, and the device comprises: bit lines connected to drains of the memory cells; latches provided for the respective bit lines or in the ratio of one latch to some bit lines; transfer gates for electrically separating the respective latches from the bit lines; bit line voltage detection circuits for detecting voltages of the respective bit lines; latch reset circuits for inverting data stored in the respective latches in accordance with the outputs from the bit line voltage detection circuits; and verify pulse generation circuits connected to the respective bit line voltage detection circuits, and generating arbitrary pulse widths By performing program verify while varying the program verify pulse widths, the threshold voltage can be set low when the pulse width is short while the threshold voltage can be set high when the pulse width is long. In this way, the threshold voltage can he controlled software-wise according to the pulse width.

According to a sixth aspect of the present invention, the semiconductor memory device of the fifth aspect further comprises: means for precharging a bit line which is selected from the bit lines connected to the drains of the memory cells, when performing program verify to decide whether programming to the memory cell has been properly performed or not; means for applying a program verify voltage to a word line of the selected memory cell in the program verify; means for setting word lines of memory cells which are not selected, to 0V or a negative voltage; means for executing program verify during the period of a verify pulse generated from the pulse generation circuit; means for setting a low threshold voltage of the memory cell by setting a short pulse width of a programming pulse; and means for setting a high threshold voltage of the memory cell by setting a long pulse width of the programming pulse. Therefore, the threshold voltage can be controlled software-wise according to the pulse width.

According to a seventh aspect of the present invention, there is provided a semiconductor memory device having nonvolatile memory cells arranged in matrix, and the device comprises: a regulator which comprises means for generating a reference voltage; means for dividing an output voltage into (n−1) stages by using n pieces of elements functioning as resistors connected in series; means for short-circuiting the m-th element (m: integer not larger than n−2) of the n pieces of elements functioning as resistors, with an output section; means for setting a resistance viewed from the output section at an arbitrary value by the short-circuiting means; means for comparing the divided voltage with the reference voltage; and means for outputting (n−1) kinds of stable voltages which are multiples of the reference voltage; and means for outputting a first voltage to be applied to the nonvolatile memory cells when reading data, a second voltage to be applied to the memory cells when programming data, arid third voltage to be applied to the memory cells when erasing data, by using the regulator. Therefore, stable voltages can be applied to the nonvolatile memory cells in reading, programming, and erasing, respectively.

According to an eighth aspect of the present invention, the semiconductor memory device of the seventh aspect further comprises: bit lines connected to drains of the memory cells; latches provided for the respective bit lines or in the ratio of one latch to some bit lines; transfer gates for electrically separating the respective latches from the bit lines; bit line voltage detection circuits for detecting voltages of the respective bit lines; latch reset circuits for inverting data stored in the respective latches in accordance with the outputs from the bit line voltage detection circuits; and a booster circuit for internally generating a high voltage to be applied to the regulator, from a power supply voltage applied to the semiconductor memory device. In this device, the output of the regulator is connected to a power supply for a decoder, and plural kinds of voltages are output from the decoder. Therefore, the data stored in the latches can be rewritten even by a slight memory cell current, resulting in a nonvolatile memory device performing stable program verify. Further, since the voltage at the word line can be made stable by the regulator, an electric field generated in a tunnel oxide film during programming is made constant, whereby variations in the threshold voltage of the memory cell can be suppressed.

According to a ninth aspect of the present invention, in the semiconductor memory device of the seventh aspect further comprises: bit lines connected to drains of the memory cells; latches provided for the respective bit lines or in the ratio of one latch to some bit lines; transfer gates for electrically separating the respective latches from the bit lines; bit line voltage detection circuits for detecting voltages of the respective bit lines; latch reset circuits for inverting data stored in the respective latches in accordance with the outputs from the bit line voltage detection circuits; and a booster circuit for internally generating a high voltage to be applied to the regulator, from a power supply voltage applied to the semiconductor memory device. In this device, the output of the regulator is connected to a power supply for each latch, and plural kinds of voltages are output from the latch to the bit line. Therefore, the data stored in the latches can be rewritten even by a slight memory cell current, resulting in a nonvolatile memory device performing stable program verify. Further, since the drain voltage can be made stable by the regulator, an electric field generated in a tunnel oxide film during programming is made constant, whereby variations in the threshold voltage of the memory cell can be suppressed. Moreover, since the programming voltage applied from the latch to the bit line can be changed by changing the output voltage of the regulator, plural times of programming can be performed with perferable programming voltages, respectively.

According to a tenth aspect of the present invention, the semiconductor memory device of the seventh aspect further comprises: bit lines connected to drains of the memory cells; latches provided for the respective bit lines or in the ratio of one latch to some bit lines; transfer gates for electrically separating the respective latches from the bit lines; bit line voltage detection circuits for detecting voltages of the respective bit lines; latch reset circuits for inverting data stored in the respective latches in accordance with the outputs from the bit line voltage detection circuits; and a booster circuit for internally generating a high voltage to be applied to the regulator, from a power supply voltage applied to the semiconductor memory device. In this device, the output of the regulator is connected to a power supply for each level shift circuit, and plural kinds of voltages are supplied from the latch through the level shift circuit to the bit line. Therefore, the data stored in the latches can be rewritten even by a slight memory cell current, resulting in a nonvolatile memory device performing stable program verify. Further, since the output (voltage) of each latch can be converted by the level shift circuit, the power supply voltage of the latch is constant even if the voltage of Vpp varies, resulting in satisfactory data holding characteristic. Furthermore, since the programming voltage applied from the level shift circuit to the bit line can be changed by changing the output voltage of the regulator, plural times of programming can be performed with preferable programming voltages, respectively.

According to an eleventh aspect of the present invention, there is provided a semiconductor memory device having nonvolatile memory cells arranged in matrix, and the device comprises: bit lines connected to drains of the memory cells; flip-flops provided for the respective bit lines or in the ratio of one flip-flop to some bit lines; shift registers each constructed by connecting two adjacent flip-flops such that a data input terminal of one flip-flop is connected to a data output terminal of the other flip-flop; transfer gates for electrically separating the respective flip-flops from the bit lines; bit line voltage detection circuits for detecting voltages of the respective bit lines; flip-flop reset circuits for inverting data stored in the respective flip-flops in accordance with the outputs from the bit line voltage detection circuits; and means for setting data to be programmed by serially inputting data to the shift registers. Therefore, the band width of an input data terminal can be set narrow, whereby the layout area can be reduced.

According to a twelfth aspect of the present invention, there is provided a semiconductor memory device having nonvolatile memory cells arranged in matrix, and the device comprises: bit lines connected to drains of the memory cells; flip-flops provided for the respective bit lines or in the ratio of one flip-flop to some bit lines; shift registers each constructed by connecting two adjacent flip-flops such that a data input terminal of one flip-flop is connected to a data output terminal of the other flip-flop; transfer gates for electrically separating the respective flip-flops from the bit lines; level shift circuits for converting the output levels of the flip-flops to a programming voltage and a verify drain voltage; hit line voltage detection circuits for detecting voltages of the respective bit lines; flip-flop reset circuits for inverting data stored in the respective flip-flops in accordance with the outputs from the bit line voltage detection circuits; and means for setting data to be programmed by serially inputting data to the shift registers. Therefore, influences of voltage fluctuation on the flip-flops can be suppressed, resulting in stable operation.

According to a thirteenth aspect of the present invention, there is provided a semiconductor memory device comprising nonvolatile memory cells arranged in matrix, word lines connected to control gates of the memory cells, bit lines connected to drains of the memory cells, source lines connected to sources of the memory cells, and latches provided for the respective bit lines or in the ratio of one latch to some bit lines for programming the memory cells, and the device performs an erasing operation on the memory cells in advance of performing a programming operation on the memory cells. In this device, preprogramming for setting a memory cell in the erased state in the programmed state is performed before the erasing operation performed in advance of the programming operation. Therefore, it is possible to avoid excessive erasing of a memory cell which is always in the erased state and excessive programming of a memory cell which is always in the programmed state, whereby the threshold voltages can be set equally and error reading can be suppressed. Further, element destruction due to damages on a tunnel oxide film can be avoided.

According to a fourteenth aspect of the present invention, there is provided a semiconductor memory device having nonvolatile memory cells arranged in matrix, and performing programming to the memory cell and program verify to decide whether the programming has been properly performed or not, and the device comprises: means for performing the program verify after the programming has been performed; means for performing reprogramming to the memory cell when the result of the program verify is "failure"; means for arbitrarily reducing the number of times of program verify as the number of times of programming increases; and means for performing programming continuously when the number of times of program verify is reduced. Therefore, when performing plural times of programming with program verify, the total programming time can be reduced.

According to a fifteenth aspect of the present invention, in the semiconductor memory device of the fourteenth aspect, when performing the programming to the memory cell and the program verify to decide whether the programming has been properly performed or not, in the sequence to execute the program verify after the programming, assuming that a predetermined programming pulse width is Tpreg and the number of times of program verify is n, an elapsed time Tpv from start of the programming, the elapsed time corresponding to the timing at which the program verify is to be performed, satisfies the following relationship:

$$Tpv=Tpreg \times 2^{(n-1)}$$

(n=1, 2, ... ).
Therefore, when performing plural times of programming with program verify, the total programming time can be reduced.

According to a sixteenth aspect of the present invention, in the semiconductor memory device of the fourteenth aspect, when performing the programming to the memory cell and the program verify to decide whether the programming has been properly performed or not, in the sequence to execute the program verify after the programming, assuming that the number of times of program verify is n, a verify point Ppv which indicates the number of times of programming after which the program verify is to be performed, satisfies the following relationship:

$$Ppv=2^{(n-1)}$$

(n=1, 2, ... ).
Therefore, when performing plural times of programming with program verify, the total programming time can be reduced.

According to a seventeenth aspect of the present invention, there is provided a semiconductor memory device having nonvolatile memory cells arranged in matrix, and the device comprises: bit lines connected to drains of the memory cells; latches provided for the respective bit lines or in the ratio of one latch to some bit lines; transfer gates for electrically separating the respective latches from the bit lines; means for selecting a bit line for programming in accordance with data stored in the latches connected to the bit lines; means for performing program verify to decide whether the programming has been properly performed or not; means for performing the program verify after the programming has been performed; and means for performing additional programming by adding a programming pulse when the result of the program verify indicates that the programming has been properly performed. Therefore, the threshold voltage of each memory cell after programming can be lowered. Further, since a memory cell whose threshold voltage before additional programming is sufficiently low, has less reduction in the threshold voltage due to the additional programming as compared with a memory cell whose threshold voltage is high, variations in threshold voltages of the memory cells can be reduced.

DETAILED DESCRIPTION OF THE PREFERRED EMBODIMENTS

Hereinafter, embodiments of the present invention will be described with reference to the drawings.

Embodiment 1

Figure 1:
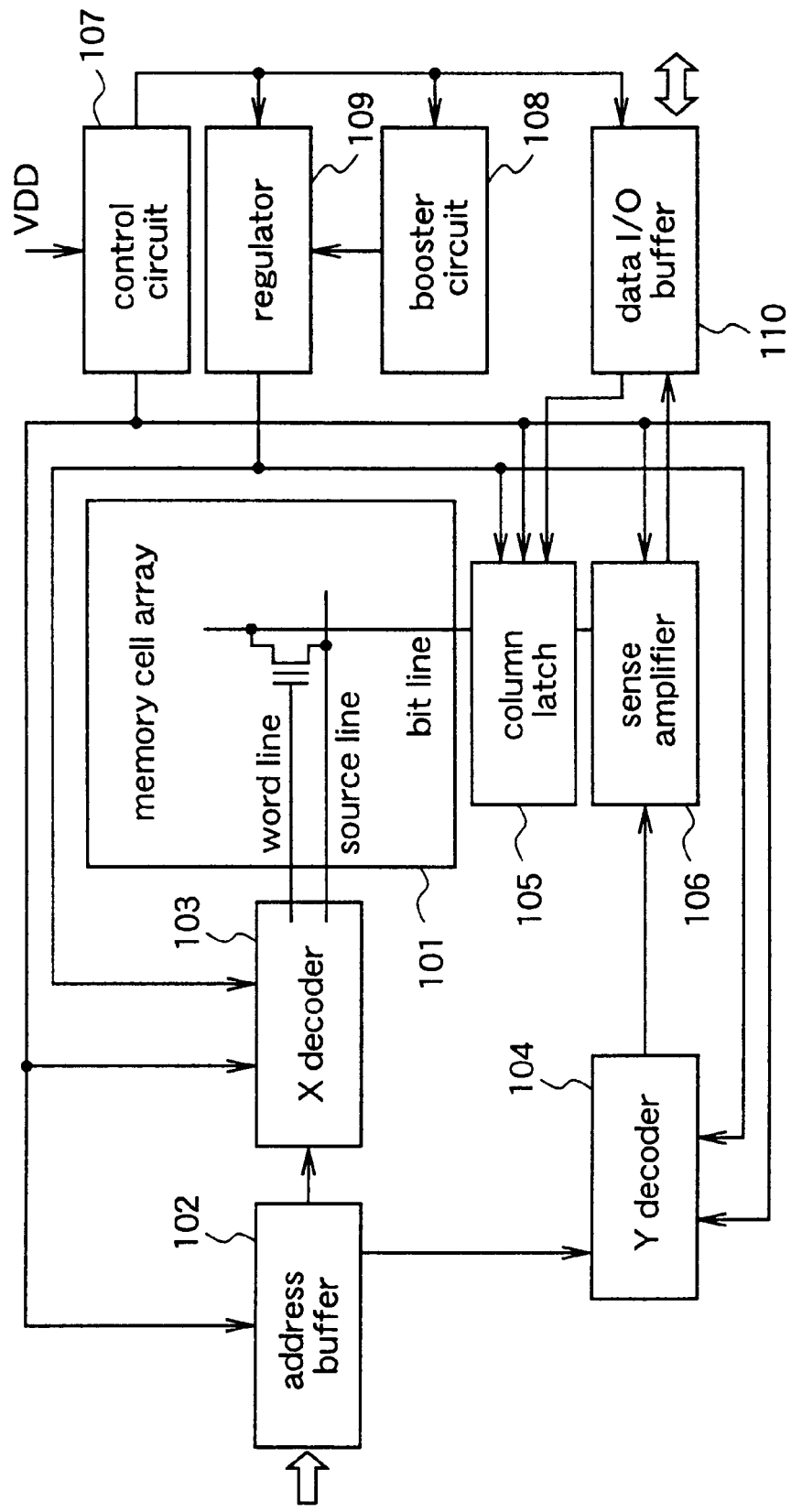
FIG. 1 is a block diagram illustrating a semiconductor memory device (nonvolatile memory device) according to a first embodiment of the present invention.

FIG. 1 is a block diagram illustrating the structure of a flash EEPROM as a semiconductor memory device (nonvolatile memory device) according to a first embodiment of the present invention.

With reference to FIG. 1, the flash EEPROM comprises a memory cell array 101, an address buffer 102, an X decoder 103, a Y decoder 104, a column latch 105, a sense amplifier 106, a control circuit 107, a booster circuit 108, a regulator 109, and a data I/O buffer 110.

In the memory cell array 101, electrically erasable and programmable memory cells are arranged in matrix. An address signal input to the nonvolatile memory device is latched by the address buffer 102, and a row address is output to the X decoder 103 to select a word line and a source line while a column address is output to the Y decoder 104 to select a bit line.

The X decoder 103 performs not only the address selection but also switching between high voltages output from the regulator 109. That is, a high positive voltage is selected when erasing data, while a high negative voltage is selected when programming data The bit line selected by the Y decoder 104 is connected with the column latch 105 and the sense amplifier 106. When data is programmed, a programming voltage of about 5V is applied from the column latch 105 to the bit lines, and when data is read, a bit line is selected by the sense amplifier 106 and data in the selected bit line is amplified. Data input/output is performed through the data I/O buffer 110. When data is programmed, data is supplied from the I/O buffer 110 to the column latch 105, and when data is read, data amplified by the sense amplifier 106 is output through the I/O buffer 110 to the outside of the nonvolatile memory device.

The control circuit 107 controls the mode of the nonvolatile memory device, and timing generation. Further, it controls the booster circuit 108 and the regulator 109.

A power supply voltage supplied from the outside is input to the booster circuit 108 to generate a high voltage. The voltage generated by the booster circuit 108 is input to the regulator 109, wherein the voltage is maintained at a constant level which is not affected by variations in the power supply voltage or variations in the temperature. In the booster circuit 109 and the regulator 109, various voltages required for reading, programming, and erasing of the nonvolatile memory device are generated, and stable power supply voltages are applied to the X decoder 103, the Y decoder 105, and tile column latch, respectively.

Figure 2:
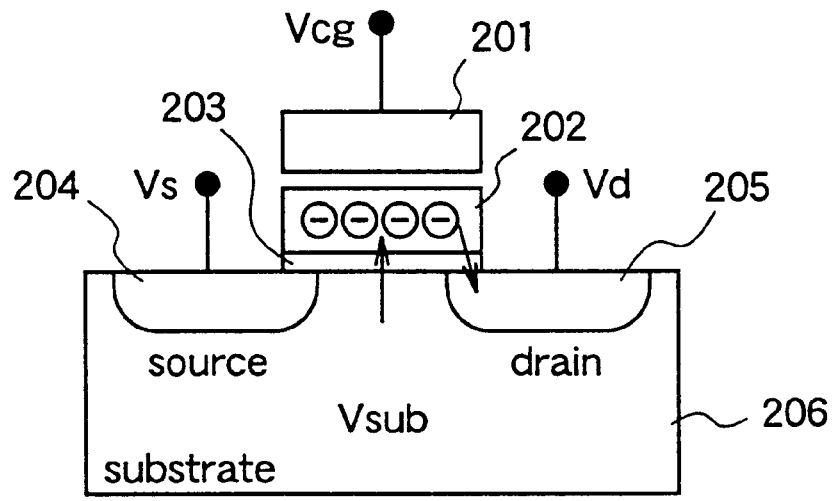
FIG. 2 is a schematic diagram illustrating a cross-sectional view of a NOR type memory cell used in the semiconductor memory device according to the first embodiment.

FIG. 2 is a schematic diagram illustrating the cross sectional view of a NOR memory cell used in the semiconductor memory device (nonvolatile memory device) according to the first embodiment shown in FIG. 1. With reference to FIG. 2, the NOR memory cell comprises a control gate 201, a floating gate 202, a tunnel oxide film 203, a source 204, a drain 205, and a substrate 206. A high electric field of 12 MV/cm~15 MV/cm is applied to the tunnel oxide film 203 to generate a tunnel current, thereby controlling the threshold voltage of the memory cell.

Figure 3:
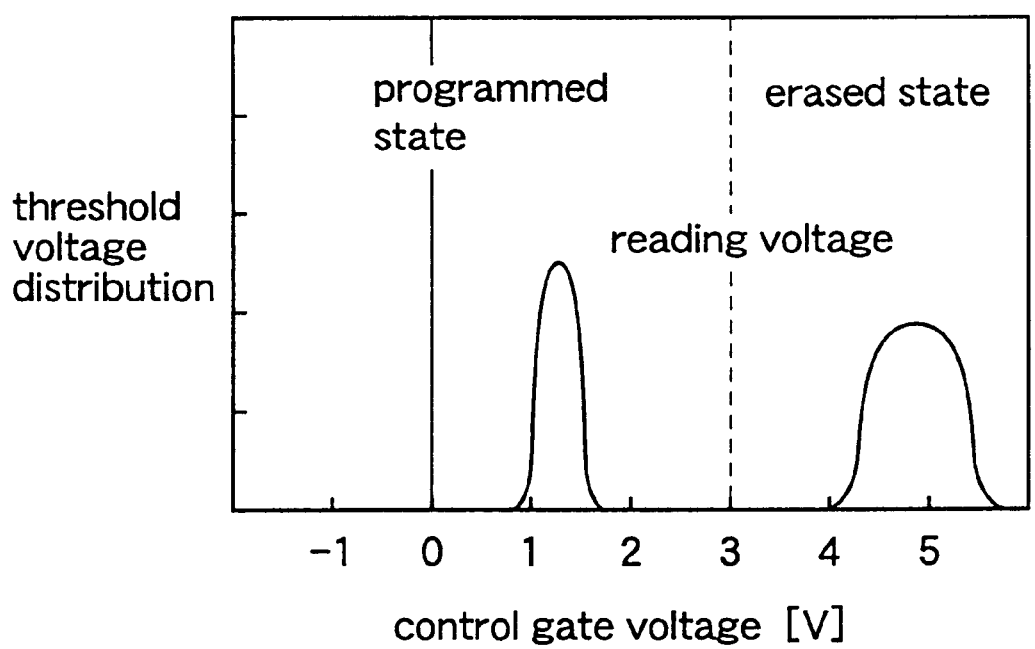
FIG. 3 is a diagram illustrating threshold value distribution of a memory cell used in the semiconductor memory device according to the first embodiment.

FIG. 3 is a diagram illustrating threshold voltage distribution of the memory cell used in the semiconductor memory device (nonvolatile memory device) of this first embodiment. In FIG. 3, the state where the threshold voltage is higher than the read voltage is referred to as "erased state" while the state where the threshold voltage is lower than the read voltage is referred to as "programmed state".

When data is erased from the memory cell, the drain is set in the open state, and 5V is applied to the control gate 201 while −8V is applied to the source 204 and the substrate 206, thereby injecting electrons from the source 204 and the substrate 206 to the floating gate 202. When electrons are injected into the floating gate 202, the threshold voltage of the memory cell increases. Setting the threshold voltage after erasing at a level higher than the read voltage prevents a cell current from flowing during reading.

On the other hand, when data is programmed, the source 204 is set in the open state, and −8V, 5V, and 0V are applied to the control gate 201, the drain 205, and the substrate 206, respectively, to draw electrons stored in the floating gate 202 into the drain 205. Since the threshold voltage after programming is lower than the read voltage as shown in FIG. 3, a cell current flows in the bit line when the programmed cell is read.

When data is read, a read voltage is applied to the selected word line, the source is grounded, and it is detected, by using the sense amplifier, whether a current flows in the bit line in the state where 1V is applied to the drain. If a current flows in the bit line, "1" (programmed state) is output to the outside of the nonvolatile memory device. When no current flows, "0" (erased state) is output.

Figure 4:
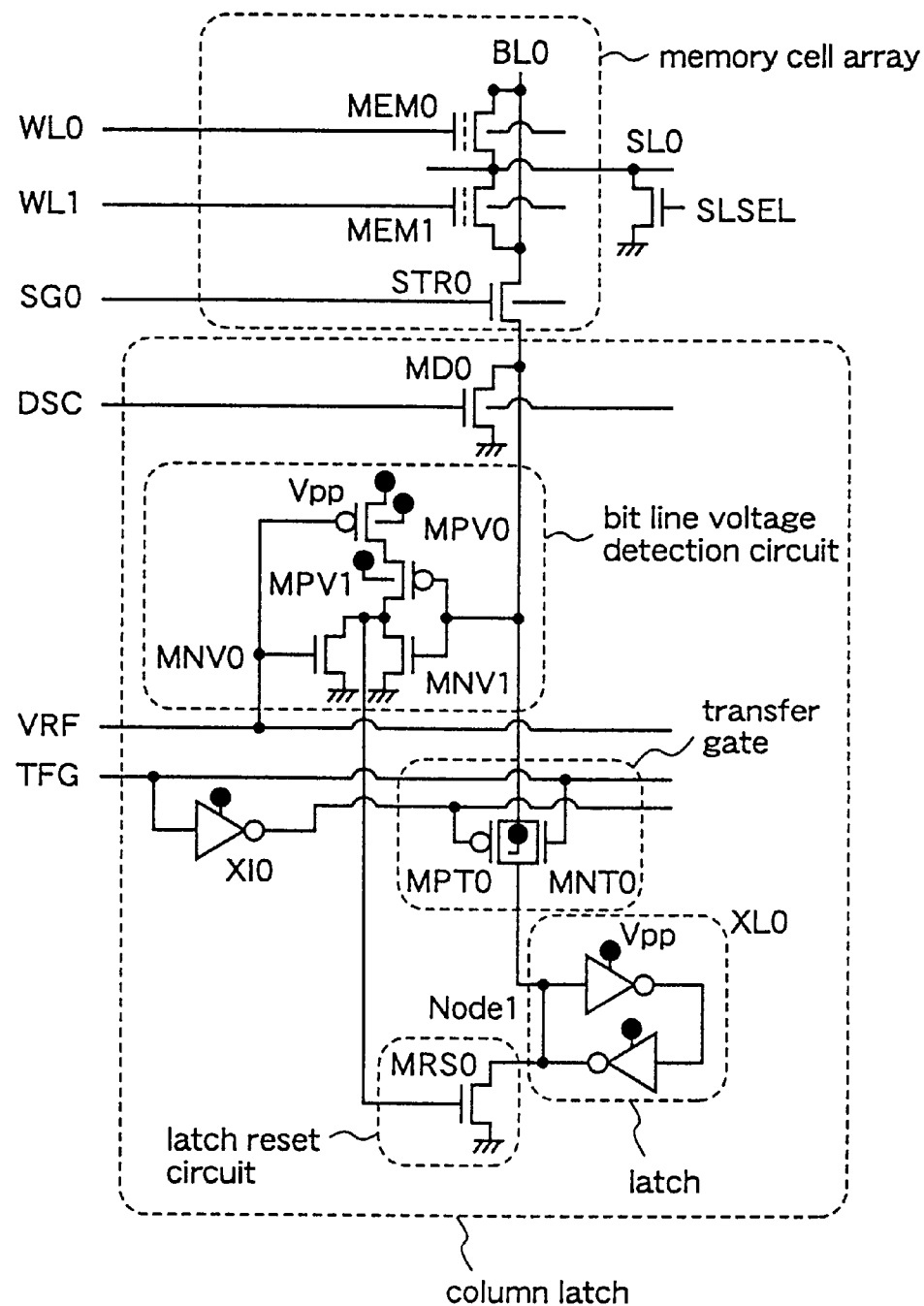
FIG. 4 is a circuit diagram illustrating a column latch having a bit line voltage detection circuit, used in the semiconductor memory device according to the first embodiment.
Figure 5:
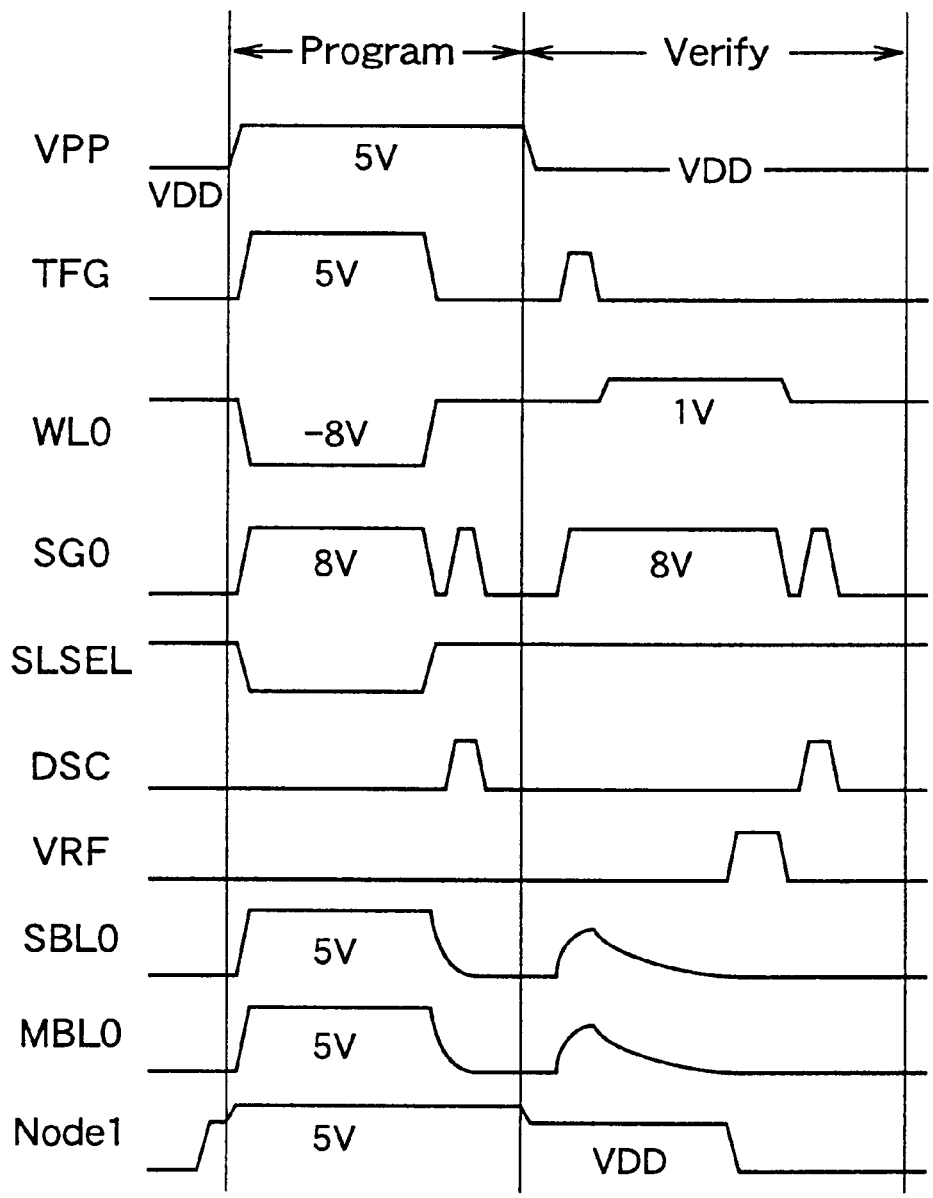
FIG. 5 is a timing chart for explaining the operation of the column latch shown in FIG. 4.

FIG. 4 is a circuit diagram illustrating the structure of a column latch having a bit line voltage detection circuit, used in the semiconductor memory device (nonvolatile memory device) of this first embodiment. FIG. 5 is a timing chart for explaining the operation of the column latch.

As shown in FIG. 4, the column latch comprises a transistor MD0 for grounding a bit line BL0, a bit line voltage detection circuit, a latch XL0 which stores data to be programmed, a transfer gate which electrically separates the bit line BL0 from the latch XL0, an inverter XI0 which makes a Pch transfer gate MPT0 active when a control signal for the transfer gate becomes active, a latch reset circuit MRS0 which resets the data in the latch on receipt of the output from the bit line voltage detection circuit.

A power supply Vpp is connected to the latch XL0 which stores data to be programmed, the Pch transfer gate MPT0 which electrically separates the bit line from the latch, the inverter XI0 which controls the Pch transfer gate MPT0, and the Pch transistors MPV0 and MPV1 of the bit line voltage detection circuit.

The bit line voltage detection circuit has the logic of NOR, and one input thereof is connected to the bit line BL0 while the other input is connected to a control signal VRF. When the control signal VRF is "L" and the voltage of the bit line is lower than the inversion point of the bit line voltage detection circuit, this circuit outputs "H" to make the latch reset circuit active.

The latch reset circuit is connected to the output of the bit line voltage detection circuit, and Node1 of the latch XL0 is grounded when the bit line voltage detection circuit outputs "H".

Next, a description is given of how the semiconductor memory device (nonvolatile memory device) constructed as described above performs programming and program verify, with reference to FIGS. 4 and 5.

In programming, initially, data to be programmed is loaded to the latch XL0. A latch (Node1) connected to a memory cell for which programming is to be performed is in the "H" state, and a latch (Node1) connected to a memory cell for which no programming is to be performed is in the "L" state. In order to perform programming to the memory cell, initially, the voltage of Vpp is set to the programming voltage (5V). Next, the control signal TFG of the transfer gate is activated to electrically connect the bit line BL0 and the latch XL0. The word line WL0 of the memory cell, which is selected at the same timing as the above operation, is set to −8V, and the control signal SLSEL of the source line is made inactive, whereby the source line is set in the open state. Further, 8V is applied to the gate of the select gate STR0 to apply the programming voltage to the drain of the memory cell. At this time, since the Vpp (5V) is applied to the drain of the select gate STR0, a voltage higher than Vpp+Vth is applied to the select gate control signal SG0 so as to avoid a voltage drop due to substrate body effect (in this first embodiment, 8V is applied).

When the latched data is "H", 5V is applied to the drain of the memory cell and 13V is applied to the tunnel oxide film, whereby an FN tunneling current flows. On the other hand, when the latched data is "L", the drain of the memory cell becomes 0V and so the voltage of the tunnel oxide film is 8V, and no FN tunneling current flows.

When the programming pulse has been applied for a predetermined period of time, the transfer gate and the select gate STR0 are made inactive to separate the bit line from the latch and, simultaneously, ground the word line and the source line.

Finally, the DSC signal and the select gate STR0 are made active to discharge the electric charge on the bit line BL0. Programming is completed through the above-described procedure.

In program verify, initially, the voltage level of Vpp is set to the verify drain voltage VDD. Next, the transfer gate and the select gate STR0 are made active to precharge only the bit line maintaining "H" to the verify drain voltage VDD. When the precharging is completed, the transfer gate is made inactive and a program verify voltage (1V) is applied to the word line of the selected memory cell to set the memory sell in the verify mode.

At this time, if programming to the memory cell has been performed properly, a slight memory cell current flows, and the electric charge on the bit line precharged to the verity drain voltage is discharged.

If there is a leakage current from the non-selected memory cell, the voltage of the bit line is lowered and this causes error decision (verify). So, the non-selected word line WL1 is grounded in advance. By setting the non-selected word line WL1 to a negative voltage, the leakage current can be further reduced.

After the memory cell current has been flowed for a predetermined period of time, the control signal VPF of the bit line voltage detection circuit is set to "L", whereby the voltage of the bit line BL0 exceeds the inversion point of the bit line voltage detection circuit to make the latch reset circuit active.

Since the latch reset circuit is designed so as to have a drive ability greater than that of the latch XL0, the latch maintained at "H" is rewritten to "L". If programming has not been performed properly, no current flows in the bit line, and the data in the latch cannot be rewritten.

After the data in the latch is rewritten to "L", the programming voltage and the verify drain voltage are not applied to the bit line.

As described above, the semiconductor memory device according to this first embodiment includes the latch which stores data to be programmed, the transfer gate which electrically separates the latch from the bit line, the bit line voltage detection circuit which detects the voltage at the bit line, and the latch reset circuit which inverts the data stored in the latch in accordance with the output of the bit line voltage detection circuit. Therefore, the data stored in the latch can he easily rewritten even with a very small memory cell current, resulting in a nonvolatile memory device which can perform reliable program verify.

In this first embodiment, in the bit line voltage detection circuit shown in FIG. 4, the source and the substrate of the Pch transistor MPV0 and the substrate of the Pch transistor MPV1 are connected to the Vpp. However, these elements may be connected to a power supply voltage (VDD) which is directly input from the outside.

Further, while in this first embodiment the bit line voltage detection circuit has the logic of NOR, any circuit structure may be employed as long as it can detect the voltage of the bit line and make the reset circuit active.

Further, while in this first embodiment an Nch transistor is employed as the latch reset circuit, any element may be employed as long as it can rewrite the latched data on receipt of the output from the bit line voltage detection circuit.

Furthermore, the range of the verify drain voltage VDD is lower than a maximum voltage at which no drain disturbance occurs and higher than a minimum voltage at which the bit line voltage detection circuit operates.

Next, a description is given of a semiconductor memory device (nonvolatile memory device) according to a modification of the first embodiment. The nonvolatile memory device according to the modification is identical to the nonvolatile memory device shown in FIG. 1 except the structure of the column latch.

Figure 6:
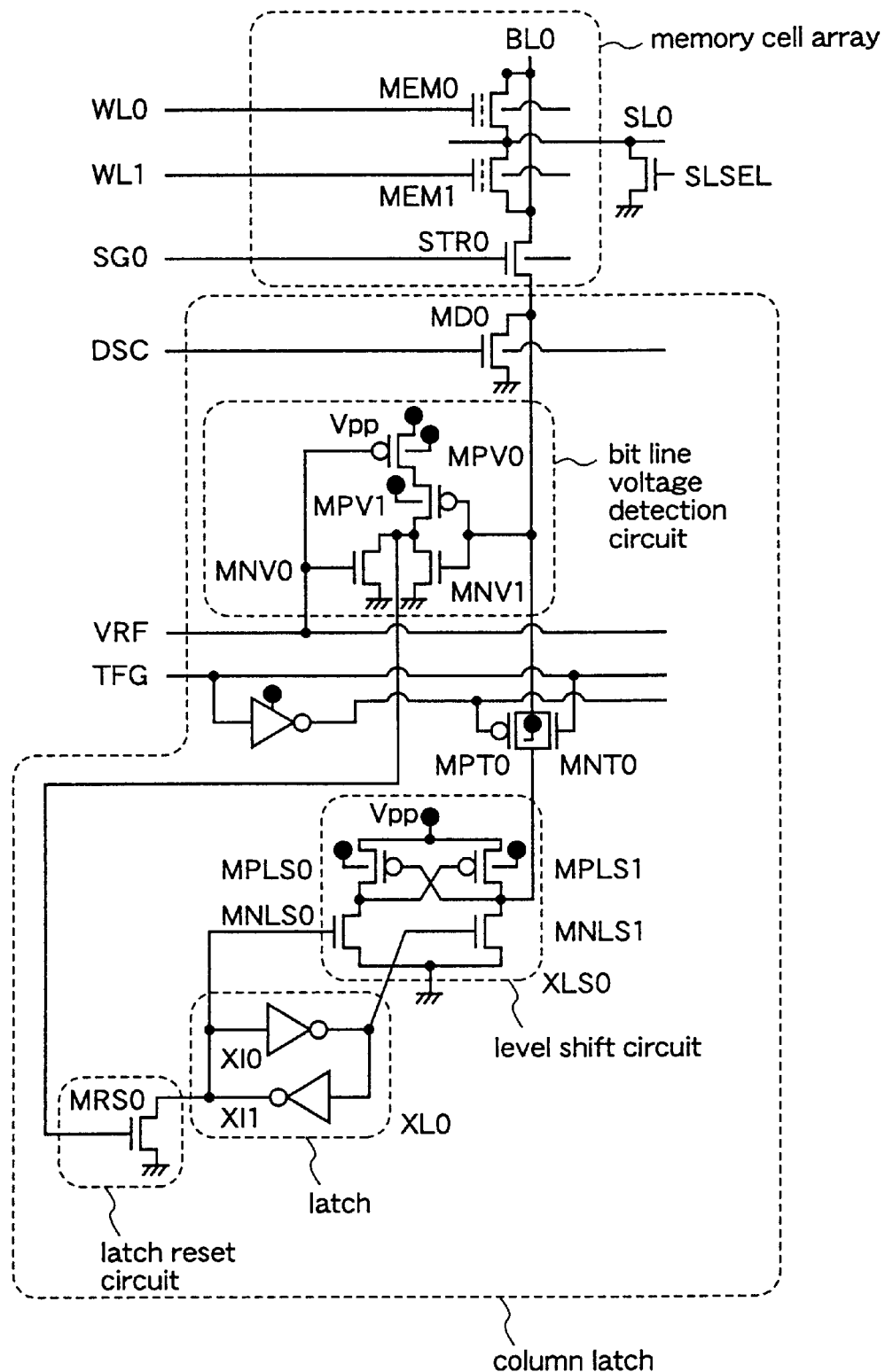
FIG. 6 is a circuit diagram illustrating a column latch having a level shift circuit, used in a semiconductor memory device according to a modification of the first embodiment.

FIG. 6 shows the structure of the column latch of the nonvolatile memory device according to the modification. In FIG. 6, the same reference symbols as those shown in FIG. 4 denote the same or corresponding parts. The column latch shown in FIG. 6 is different from the column latch shown in FIG. 4 in that the power to the latch XL0 is supplied from an external power supply VDD (not shown), and the output of the latch XL0 is connected to a level shift circuit to which the power is supplied from Vpp.

The output of the inverter XI1 of the latch is connected to the gate of the Nch transistor MNLS0 of the level shift circuit while the output of the inverter XI0 is connected to the gate of the Nch transistor MNLS1. In the level shift circuit, the Pch transistor MPLS1 and the Nch transistor MNLS1 share the drain, and this drain is connected to the transfer gate. Although the latch XL0 is driven by the VDD supplied from the outside, the voltage output from the latch XL0 is converted by the level shift circuit XLS0, and 5V is output during programming while the VDD is output during program verify.

In the modification of the first embodiment, since the output of the latch XL0 is subjected to voltage conversion by the level shift circuit XLS0, no leakage current occurs even when the voltage of Vpp varies in the range from 2V to 7V. Further, since the latch XL0 is driven by the VDD supplied from the outside, it can hold data stably even when the operating mode of the column latch varies and thereby the Vpp level varies. Furthermore, since the Pch transistor MPLS1 serves as a driver for driving the bit line during programming, the driving ability of the latch can be minimized, whereby inversion of the latched data is easily performed in program verify.

Other components and operation of the column latch according to the modification are identical to those of the column latch already described with respect to FIG. 4 and, therefore, do not require repeated description.

Embodiment 2

Hereinafter, a semiconductor memory device (nonvolatile memory device) according to a second embodiment of the present invention will be described with reference to the drawings.

The nonvolatile memory device of this second embodiment is identical to the device of first embodiment shown in FIG. 1 except the structure of the column latch.

Figure 7:
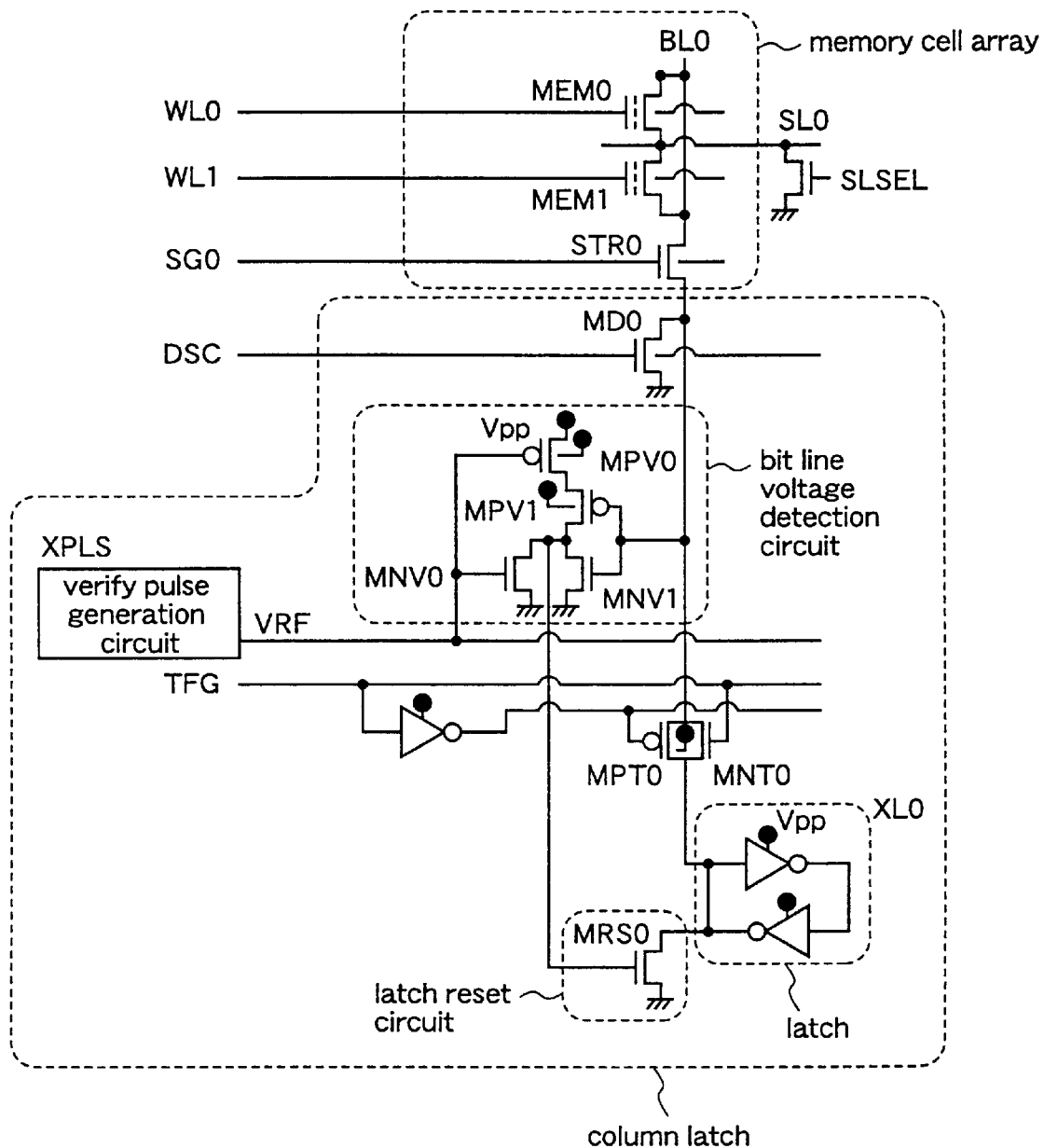
FIG. 7 is a circuit diagram illustrating a column latch used in a semiconductor memory device (nonvolatile memory device) according to a second embodiment of the present invention.

FIG. 7 is a diagram illustrating a column latch according to the second embodiment. In FIG. 7, the same reference symbols as those shown in FIG. 4 denote the same or corresponding parts. The column latch of this second embodiment (FIG. 7) is different from the column latch of the first embodiment (FIG. 4) in that a verify pulse generation circuit XPLS which can arbitrarily set a pulse width to be given to an input terminal VRF of the bit line voltage detection circuit, is added.

In program verify, the voltage of the bit line discharged by a very small current of the memory cell is sensed by the bit line voltage detection circuit to start the latch reset circuit.

When the sense time by the bit line voltage detection circuit, i.e., the pulse width of program verify (the pulse of VRF shown in FIG. 5) is short, discharge from the bit line is not sufficiently performed and, therefore, the reset circuit is not started. That is, as the data in the latch is not rewritten, reprogramming is performed, resulting in a reduction in the threshold voltage of the memory cell.

On the other hand, when the sense time by the bit line voltage detection circuit (the pulse width of program verify) is long, discharge from the bit line is sufficiently performed, whereby the reset circuit is started and the data in the latch is rewritten.

Figure 8:
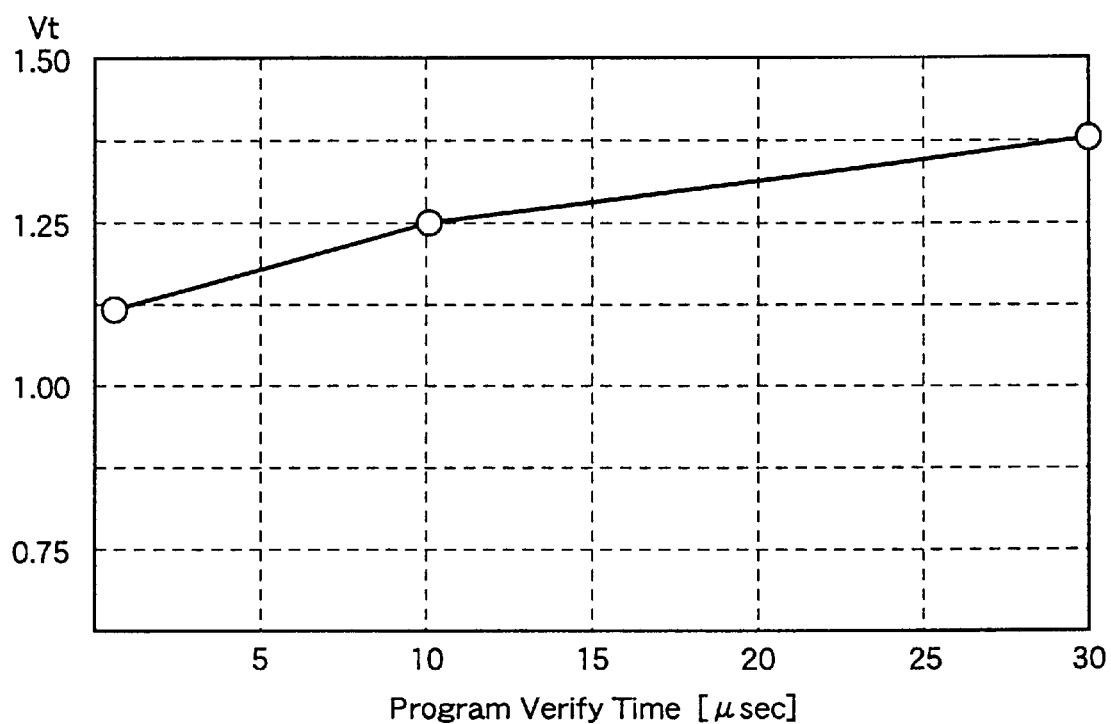
FIG. 8 is a diagram illustrating the relationship between the program verify pulse width and the threshold voltage of the memory cell.

FIG. 8 is a diagram showing the relationship between the program verify pulse width (program verify time: μsec) and the threshold voltage (Vt) of the memory cell.

As seen from FIG. 8, when the program verify time varies from 1 μsec to 30 μsec, the threshold voltage of the memory cell increases from 1.12V to 1.37V.

Accordingly, when the output signal from the verify pulse generation circuit XPLS is applied to the input of the bit line voltage detection circuit to perform program verify while varying the verify pulse width (the pulse of VRF shown in FIG. 5), the threshold voltage can be set low when the program verify pulse width is short, and it can be set high when the pulse width is long. That is, the threshold voltage can be controlled software-wise according to the pulse width.

Figure 9:
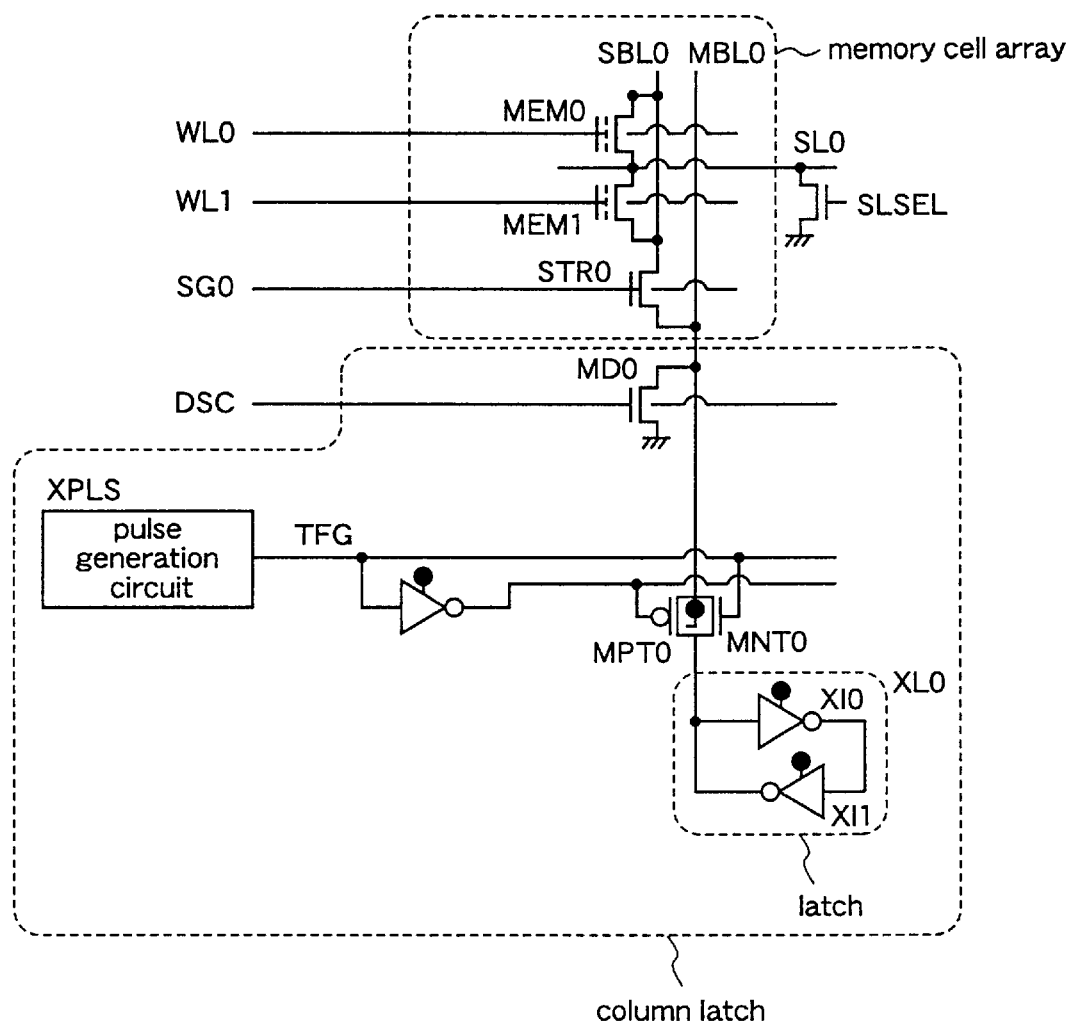
FIG. 9 is a circuit diagram illustrating a column latch used in a semiconductor memory device according to a modification of the second embodiment.

Next, a description is given of a semiconductor memory device (nonvolatile memory device) according to a modification of the second embodiment. FIG. 9 shows the structure of a column latch of the nonvolatile memory device according to the modification. The column latch of this modification comprises a sub bit line SBL0 connected to drains of memory cells arranged in matrix, a select gate STR0 which electrically connects the sub bit line SBL0 with a main bit line MBL0, a latch XL0 which stores data to be programmed, a transfer gate which electrically connects the main bit line MBL0 with the latch XL0, and a transistor MD0 which discharges the electric charge on the bit line.

In program verify, initially, precharge to the bit line is performed. A power supply voltage VDD is applied to the latch XL0, and the latch XL0 holds data of "H". In this state, the output TFG of the pulse generation circuit XPLS and the select gate control signal SG0 become "H", whereby the voltage VDD of the latch XL0 is precharged to the end of the sub bit line SBL0.

When the precharge has been completed, the selected word line WL0 becomes active, and a memory cell current flows if programming has been properly performed.

Since the current ability of the inverter XI1 of the latch XL0 is set extremely small, the sub bit line SBL0 and the main bit line MBL0 are discharged with a very small memory cell current and thereby the data in the latch XL0 is inverted.

Since an arbitrary pulse width can be output from the pulse generation circuit XPLS, when the pulse width of TFG during program verify (see FIG. 5) is long, the threshold voltage is set high, and when the pulse width is short, the threshold voltage is set low, as shown in FIG. 8.

As in the case of the column latch according to the first embodiment, also in the column latch shown in FIG. 9, the leakage current from the non-selected memory cell can be suppressed by making the non-selected word line WL1 negative in program verify.

Embodiment 3

Hereinafter, a nonvolatile memory device according to a third embodiment of the present invention will be described with reference to the drawings.

Figure 10:
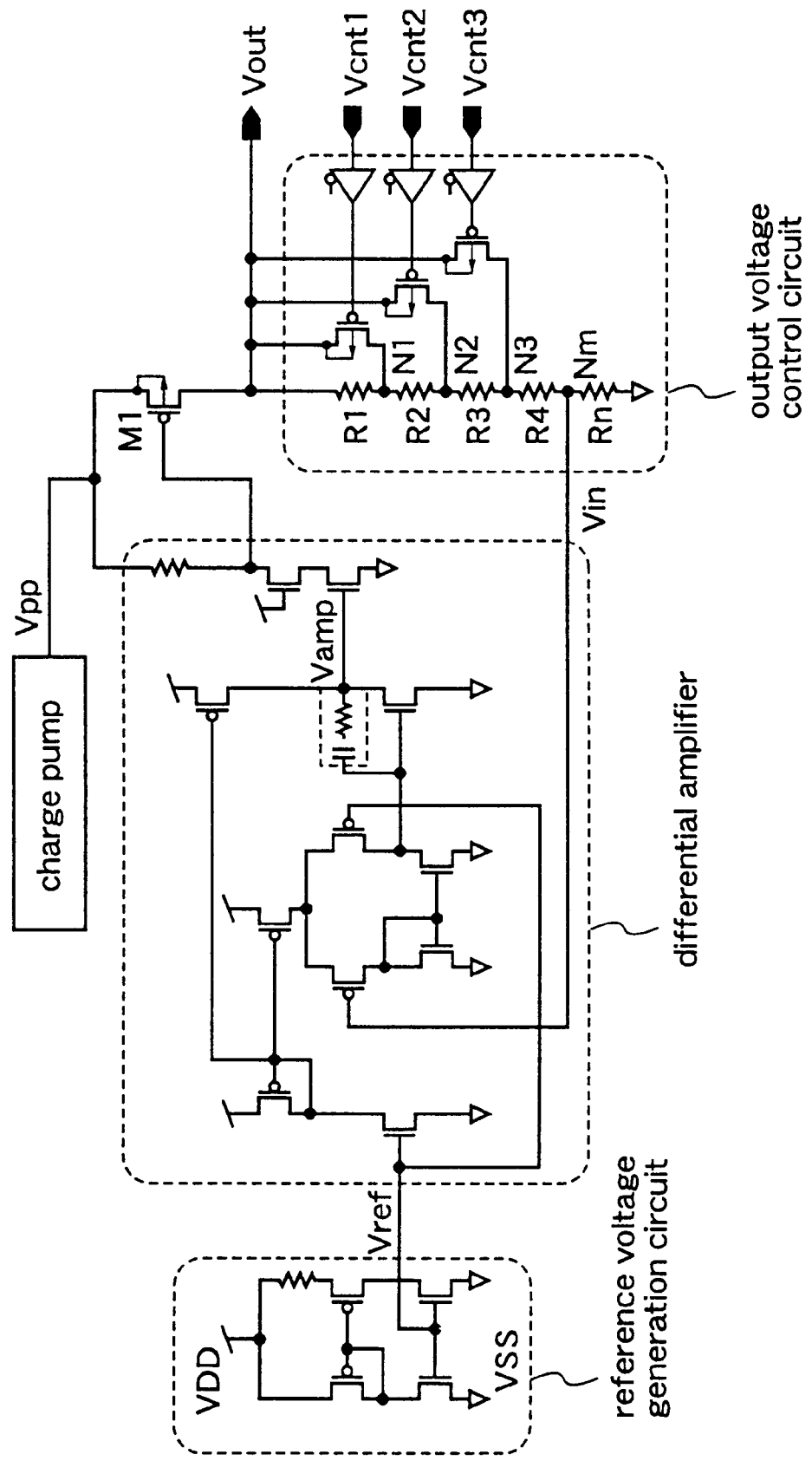
FIG. 10 is a circuit diagram illustrating a regulator used in a semiconductor memory device (nonvolatile memory device) according to a third embodiment of the present invention.

FIG. 10 is a circuit diagram illustrating the structure of a regulator used in the nonvolatile memory device of this third embodiment, which regulator maintains the output (voltage) of a charge pump constant. As shown in FIG. 10, the regulator of this third embodiment comprises a reference voltage generation circuit, a differential amplifier, and an output voltage control circuit.

Initially, the reference voltage generation circuit generates a reference voltage Vref to be compared. In the output voltage control circuit, n stages of resistors R1~Rn are connected in series between an output section Vout and the ground, whereby Vout is potential-divided into (n−1). The respective nodes (N1, N2, N3, . . . , Nm) as the result of the resistive potential division are connected to the output section Vout through Pch transistors, and these nodes (N1, N2, N3, . . . , Nm) are electrically connected to the Vout by control signals (Vcnt1, Vcont2, Vcont3). For example, when all the control signals Vcnt1~Vcont3 are "H", the output section Vout is divided into (n−1) by n pieces of resistors connected in series. When Vcont1 is "L", the output section Vout is divided into (n−2) by (n−1) pieces of resistors. Likewise, the resistance components are cut by controlling Vcnt2 and vcnt3. As the result, (n−1) kinds of resistance values, (R4+Rn), (R3+R4+Rn), (R2+R3+R4+Rn), and (R1+R2+R3+R4+Rn), are obtained.

In the differential amplifier, the reference voltage Vref generated by the reference voltage generation circuit is compared with the voltage Vin obtained by the potential division in the output voltage control circuit. If the voltage Vin is higher than the reference voltage Vref, the Pch transistor M1 is cut off, and the voltage of the output part Vout decreases. Conversely, when the voltage Vin is lower than the reference voltage Vref, the Pch transistor M1 is turned on, and the voltage of the output pert Vout increases. In this way, even when the voltage at the output section Vout varies, the voltage Vin obtained by resistive potential division of the Vout varies with the variation in the Vout and is compared with the reference voltage Vref in the differential amplifier. Therefore, the output section Vout can maintain a constant voltage.

In the output voltage control circuit, when the control signal Vcnt1 is "L", the node N1 and the output section Vout are short-circuited, and the Vout has series resistors R2~Rm. As the resistor R1 is cut, the voltage of Vin increases, the current in the transistor M1 decreases, and the voltage of Vout decreases. When the control signal Vcnt2 is "L", the voltage of Vin further increases, and the voltage of Vout further decreases. When the control signal Vcnt3 is "L", the voltage of Vin further increases and the voltage Vout further decreases.

As described above, since the output voltage control circuit of the regulator employs n stages of series resistors to generate (n−1) kinds of resistance values, (n−1) kinds of output voltages can be obtained.

While in the output voltage control circuit shown in FIG. 10 resistors are used for resistive potential division, any element, such as a transistor, may be employed as long as it can serve as a resistor.

Next, a description is given of how the nonvolatile memory device having the above-described regulator performs programming and program verify.

Figure 11:
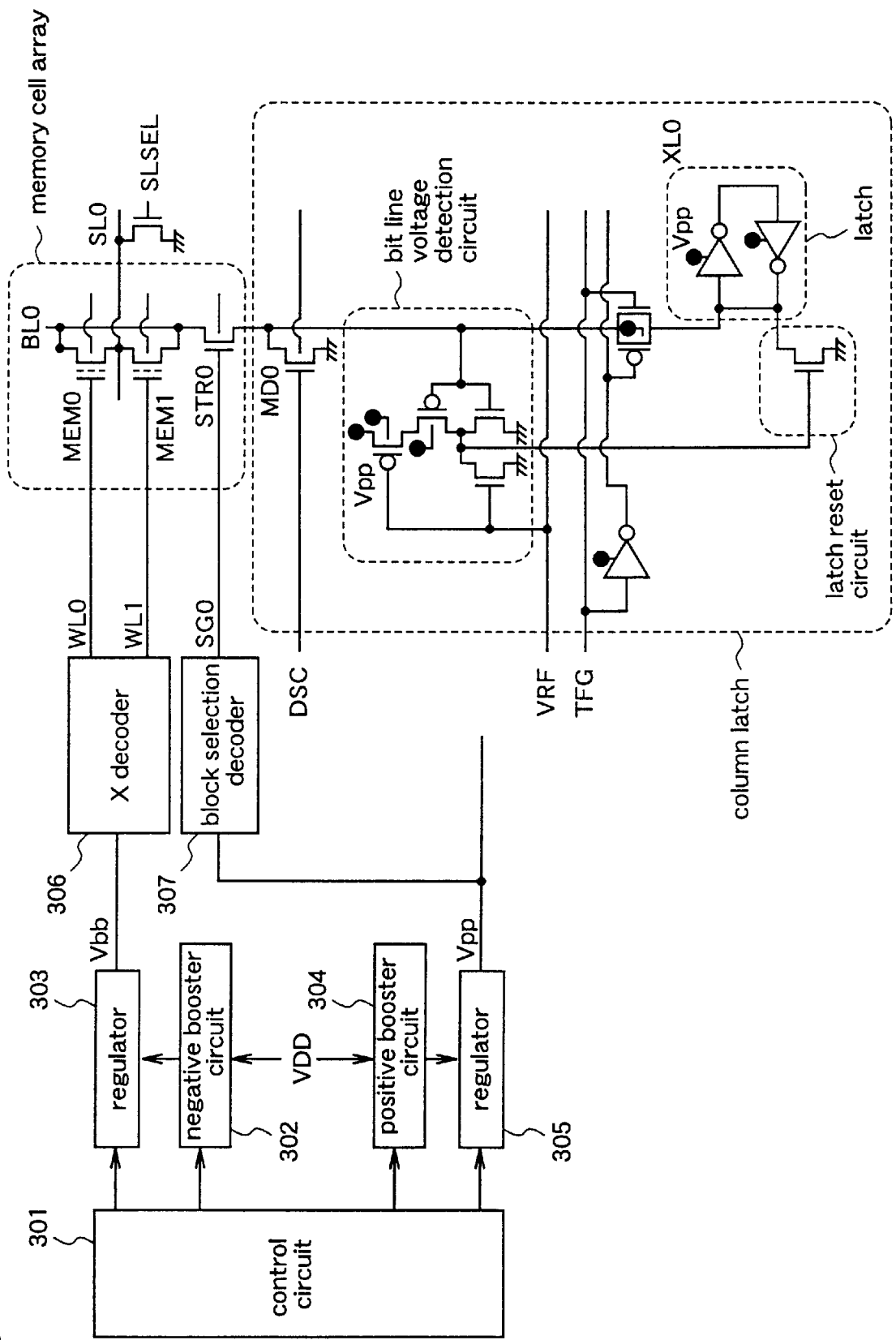
FIG. 11 is a block diagram illustrating the semiconductor memory device according to the third embodiment.

FIG. 11 is a block diagram illustrating the structure of a nonvolatile memory device according to the third embodiment. In FIG. 11, 302 denotes a negative booster circuit, 303 denotes a regulator for maintaining the output (voltage) of the negative booster circuit 302 constant, 304 denotes a positive booster circuit, and 305 denotes a regulator for maintaining the output (voltage) of the positive booster circuit 304 constant. The booster circuits 302 and 304 and the regulators 303 and 305 are controlled by a control circuit 301. Each of the regulators 303 and 305 has the structure shown in FIG. 10. Further, 306 denotes an X decoder for selecting word lines (WL0 and WL1) of memory cells. BL0 denotes a bit line connected to the drains of the memory cells, and STR0 denotes a select gate for selecting the bit line. 307 denotes a block select decoder for selecting the select gate STR0. Further, the nonvolatile memory device of this third embodiment includes a column latch identical to that shown in FIG. 4.

Initially, in programming, −8V is applied to the control gate of the memory cell MEM0 while Vpp (5V) is applied to the drain, whereby electrons injected into the floating gate are drawn from the drain side.

The negative booster circuit 302 generates a negative voltage lower than −8V to be applied to the word lines from the external power supply VDD. Generally, a charge pump circuit is used as a negative booster circuit, but the output of the charge pump circuit is affected by a waveform of a control clock, thereby generating a voltage fluctuation. The regulator 303 maintains the output (voltage) from the negative booster circuit 302 constant, and the constant voltage is applied to the X decoder 306 for decoding the word lines.

On the other hand, a high voltage to be applied to the drain of the memory cell MEM0 is generated by the positive booster circuit 304. Generally, a charge pump circuit is used as a positive booster circuit, but the output voltage is affected by the power supply voltage or the frequency of the clock input to the charge pump. A high voltage exceeding 5V is generated by the positive booster circuit 304, and the unstable output voltage from the booster circuit is maintained constant by the regulator 305.

As shown in the circuit diagram of the regulator (FIG. 10), the output section Vout of the output voltage control circuit is potential-divided by, for example, 5 stages of resistors so that it outputs 4 kinds of voltages. The constant voltage Vpp output from the regulator 305 is applied to the Pch transistor of the bit line voltage detection circuit of the column latch, the Pch transfer gate which electrically connects the bit line with the latch, and the Pch transistor inside the latch. Accordingly, four kinds of program voltages are applied to the drain of the memory cell.

By performing programming with the first pulse at a low voltage, an electric field generated in the tunnel oxide film can be reduced. On and after the second pulse, the regulation voltage is increased with every increment in the number of pulses, whereby the programming time can be reduced when the number of times of programming increases.

Further, since the power supply voltage stabilized by the booster circuit and the regulator is supplied to the column latch, the voltage at the word line and the drain voltage are stabilized, and the electric field generated in the tunnel oxide file during programming becomes constant, whereby variation of the threshold voltage is reduced.

Since programming and program verify by the nonvolatile memory device shown in FIG. 11 are identical to those already described for the nonvolatile memory device using the column latch shown in FIG. 4, no repeated description is necessary.

Next, a description is given of a nonvolatile memory device according to a modification of the third embodiment.

Figure 12:
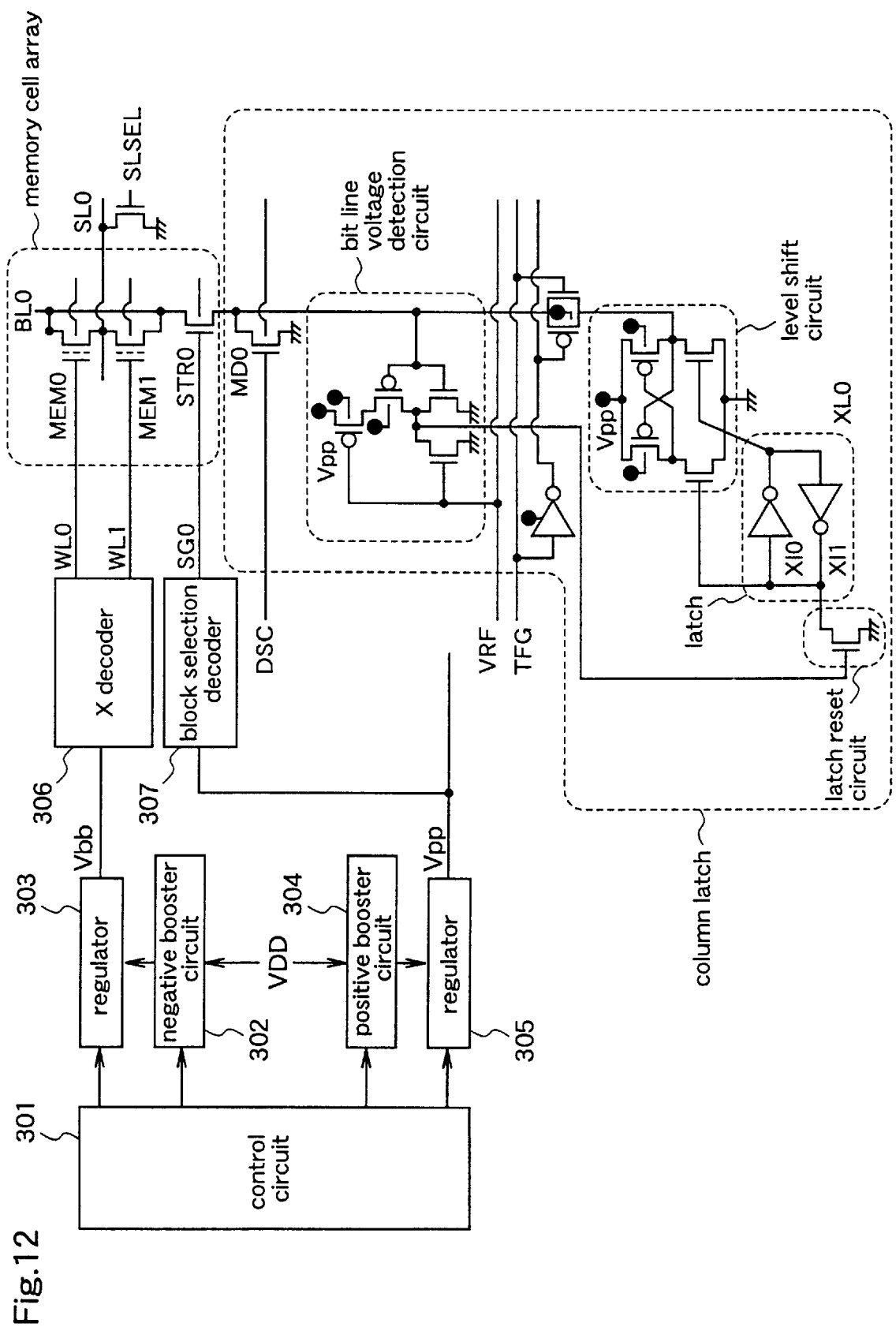
FIG. 12 is a block diagram illustrating a semiconductor memory device according to a modification of the third embodiment.

FIG. 12 is a block diagram illustrating the structure of the nonvolatile memory device according to the modification. In FIG. 12, 301 denotes a control circuit, 302 denotes a negative booster circuit, 303 denotes a regulator for maintaining the output (voltage) of the negative booster circuit constant, 304 denotes a positive booster circuit, 305 denotes a regulator for maintaining the output (voltage) of the positive booster circuit constant, 306 denotes an X decoder for selecting a word line, and 307 denotes a block select decoder for selecting a select gate STR0. These components are identical to those shown in FIG. 11.

The nonvolatile memory device shown in FIG. 12 is different from the nonvolatile memory device shown in FIG. 11 in that the power to the latch XL0 is supplied from an external power supply VDD, the output of the latch XL0 is connected to the level shift circuit, and the power to the level shift circuit is supplied from Vpp.

The data stored in the latch XL0 is input to the level shift circuit to be converted to the programming voltage Vpp. A high voltage generated by the positive booster circuit 304 is input to the regulator 305 to be maintained constant and then applied to the power supply of the level shift circuit.

As shown in the circuit diagram of the regulator (FIG. 10), the output section Vout of the output voltage control circuit is divided by, for example, five stages of resistors so that it can output four kinds of voltages. Accordingly, four kinds of program voltages can be applied to the drain of the memory cell.

Since the operation of the circuit shown in FIG. 12 is identical to that already described with respect to FIG. 11, repeated description is not necessary.

As described above, in the modification of the third embodiment, since the output voltage of the regulator 305 is applied to the power supply of the level shift circuit, variation in the output of the regulator do not affect the power supply of the latch, resulting in stable operation.

Embodiment 4

Hereinafter, a nonvolatile memory device according to a fourth embodiment of the invention will be described with reference to the drawings.

The nonvolatile memory device according to this fourth embodiment is fundamentally identical to the nonvolatile memory device according to the first embodiment shown in FIG. 1 except the structure of the column latch.

Figure 13:
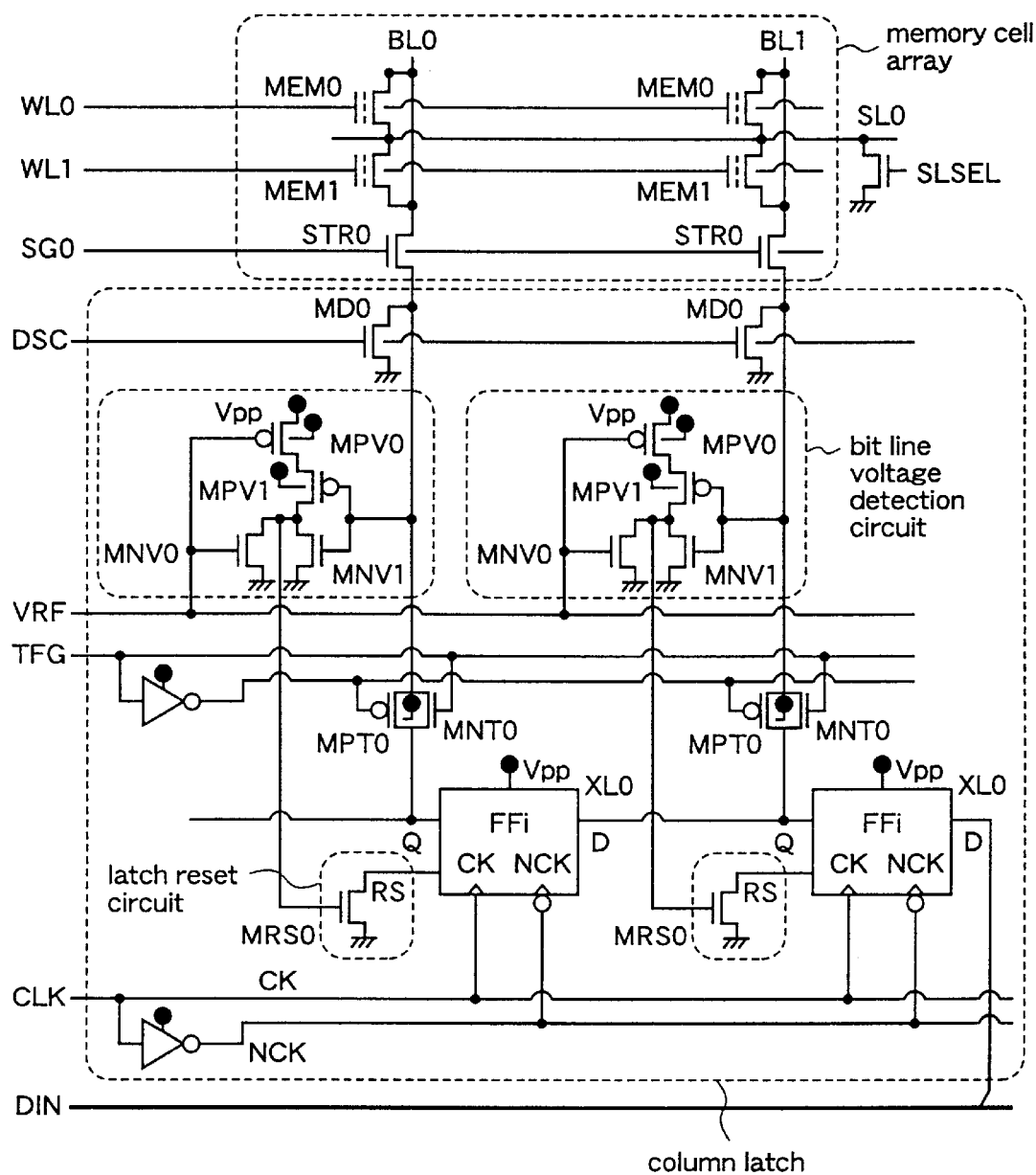
FIG. 13 is a circuit diagram illustrating a column latch used in a semiconductor memory device (nonvolatile memory device) according to a fourth embodiment of the present invention.

FIG. 13 is a diagram illustrating a column latch according to this fourth embodiment. This column latch is different from the column latch shown in FIG. 4 in that latches XL0 are flip-flop circuits. Other components are identical to those of the column latch shown in FIG. 4.

A flip-flop FFi has a data input terminal D, a data output terminal Q, a reset terminal RS, a clock input CK, and an inverted clock input NCK. When "L" is input to the reset Terminal RS, the flip-flop FFi resets data stored therein (i.e., it sets the data to "L"). The flip-flop FFi latches data of the input terminal D at the rising edge of the clock CK. Between two adjacent flip-flops FFi, the output of one flip-flop is connected to the input of the other flip-flop, thereby forming a shift register. A data input terminal DIN is connected to the first-stage flip-flop FFi, and data is input according to the leading edge of the clock CK. Assuming that y pieces of flip-flops FFi are connected to constitute a y-bit shift register, data can be loaded to the flip-flops FFi by inputting y cycles of clocks.

As described above, in the column latch, since the programming voltage Vpp is applied to the bit line to be subjected to programming, the latch must be maintained "H". By maintaining the latch "H", the power Vpp to the latch is transmitted as it is to the bit line and thereby programming is carried out.

Accordingly, "H" is input to the bit line for which programming is to be performed while "L" is input to the bit line for which programming is not to be performed, through the data input terminal DIN, at the leading edge of clock, whereby data is set in the column latch.

As described above, in this fourth embodiment of the invention, since flip-flops are used as data storage means of the column latch and shift registers are constructed by using these flip-flops, the band width of the input data terminal DIN can be narrowed to reduce the layout area.

Since programming and program verify of this fourth embodiment are identical to those already described for the first embodiment, repeated description is not necessary.

Next, a description is given of a nonvolatile memory device according to a modification of the fourth embodiment.

Figure 14:
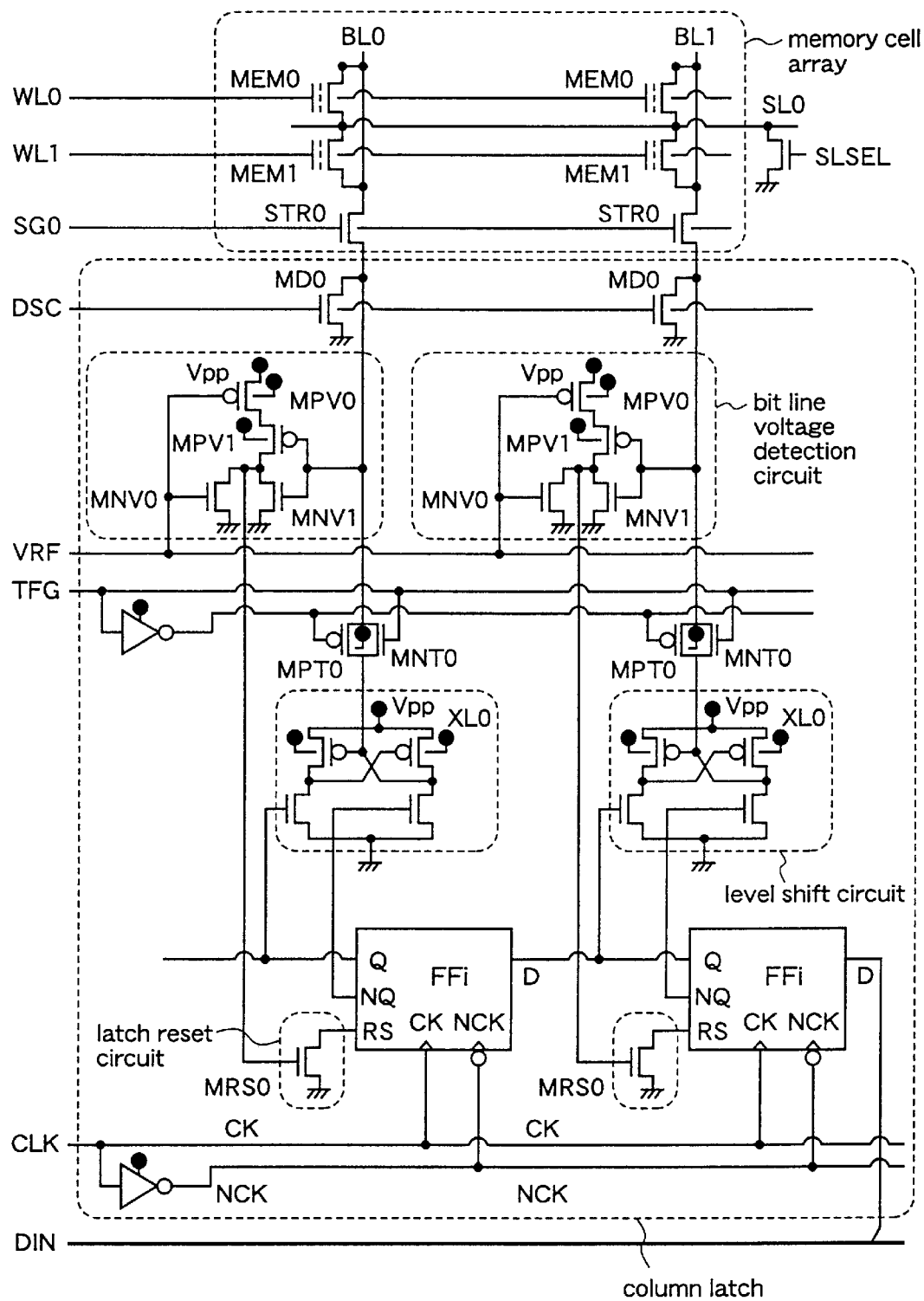
FIG. 14 is a circuit diagram illustrating a column latch used in a semiconductor memory device according to a modification of the fourth embodiment.

FIG. 14 is a diagram illustrating the structure of a column latch of the nonvolatile memory device according to the modification. The column latch shown in FIG. 14 is different from the column latch shown in FIG. 13 in that the power to the flop-flops FFi is supplied from an external VDD power supply, the output of each flip-flop FFi is connected to a level shift circuit, and the power to the level shift circuit is supplied from Vpp.

As described above, according to the modification, the VDD is supplied to the flip-flops and the output (voltage) from each flip-flop is converted by the level shift circuit. Therefore, even when the operating mode of the column latch varies and the voltage of Vpp varies, the flip-flops FFi are hardly affected by these variations, resulting in stable operation.

Further, since the level shift circuit serves as a drive transistor for driving the bit line, the size of the transistor in the flip-flop can be minimized, whereby reset of data is facilitated.

Embodiment 5

Hereinafter, a nonvolatile memory device according to a fifth embodiment of the invention will be described with reference to the drawings.

Figure 15:
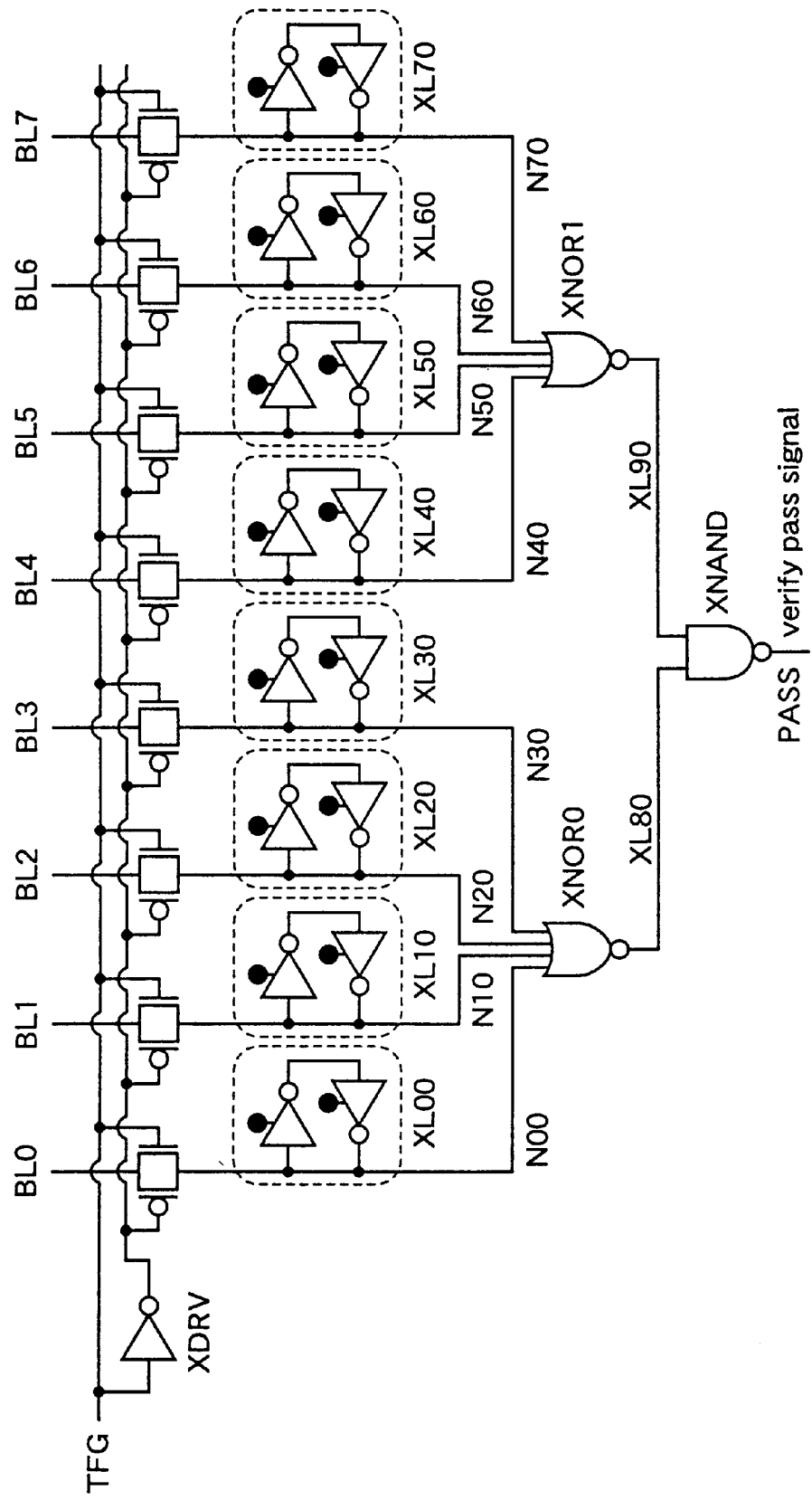
FIG. 15 is a diagram illustrating a circuit for outputting a verify pass signal used in a semiconductor memory device (nonvolatile memory device) according to a fifth embodiment of the present invention.

FIG. 15 is a diagram illustrating a circuit which outputs a verify pass signal in programming, included in the nonvolatile memory device according to the fifth embodiment. In this fifth embodiment, output of the verify pass signal will be described by using 8-bit data latches. As already described for the first to fourth embodiments, data of "H" is set in a latch for a bit line for which programming is performed while data of "L" is set in a latch for a bit line for which programming is not performed. When programming to the memory cell is completed, the data in the latch is reset to "L", and further programming is not carried out. When programming to all the bit lines is completed, all the latches are set to "L". The output signals N00~N70 from the latches are input to, four-input NOR gates XNOR0 and XNOR1, and the outputs from the four-input NOR gates XNOR0 and XNOR1 are input to a two-input NAND gate XNAND. As long as data of "H" exists in even one latch amongst the latches XL00 to XL70, the verify pass signal PASS remains at "L". Only when data in all the latches become "L", "H" is output from the verify pass signal PASS.

In other words, when the verify pass signal PASS is output, this means that all the latches are reset to "L" and, therefore, programming is completed.

As described above, it is possible to set a flag indicating that programming is completed, by taking a logic product or a logic sum of all the outputs from the column latches. Further, the data in the latches are not rewritten until program verify is performed or new data is loaded. In the meantime, the latches continuously output the data. Since the verify pass signal PASS continuously outputs data as well, control for signal output is not needed, and it is not necessary to consider the timing to latch the verify pass signal PASS.

While in this fifth embodiment output of the verify pass signal is explained by using 8 bit lines, the number of bit lines is not restricted thereto.

Embodiment 6

Hereinafter, a nonvolatile memory device according to a sixth embodiment of the present invention will be described with reference to the drawings.

Figure 16:
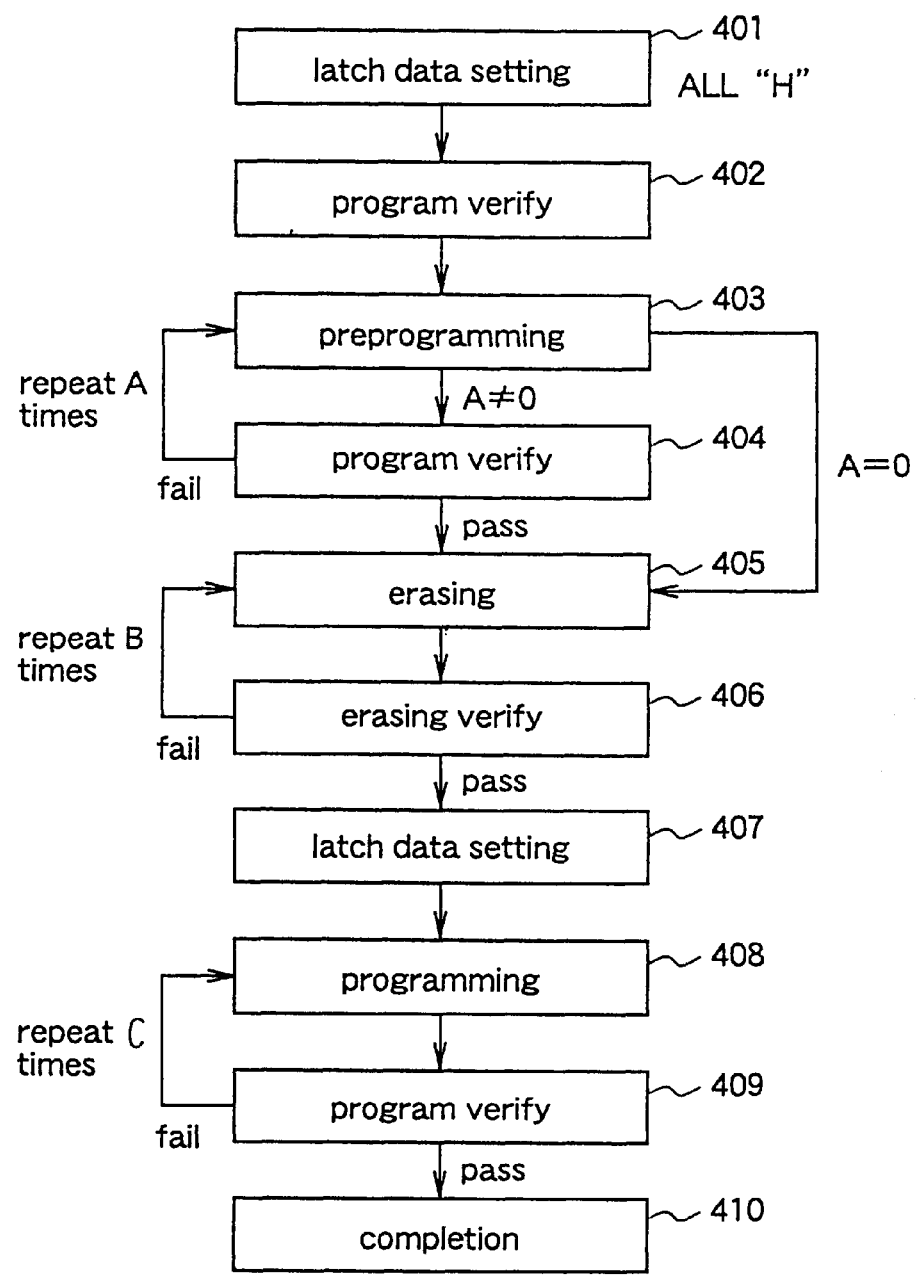
FIG. 16 is a flowchart for explaining the operation of a semiconductor memory device (nonvolatile memory device) according to a sixth embodiment of the present invention.
Figure 17:
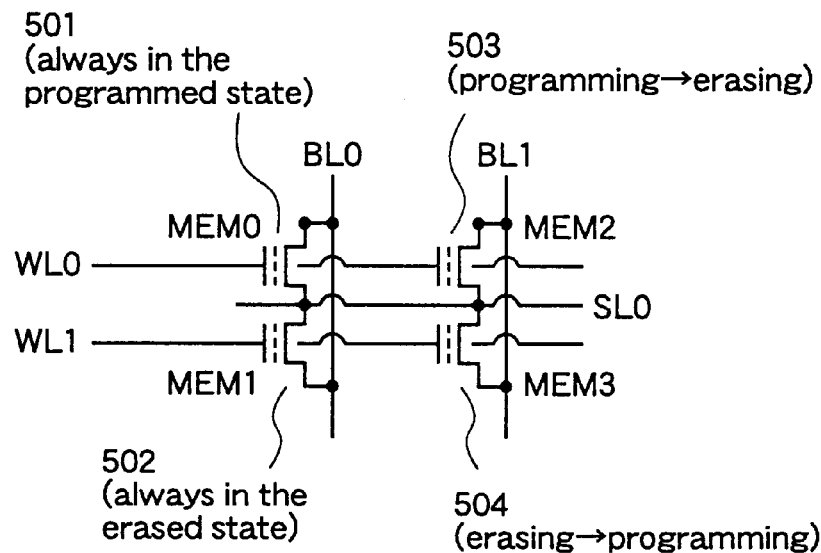
FIG. 17 is a circuit diagram illustrating memory cells arranged in matrix, for explaining the operation of the semiconductor memory device according to the sixth embodiment.
Figure 18:
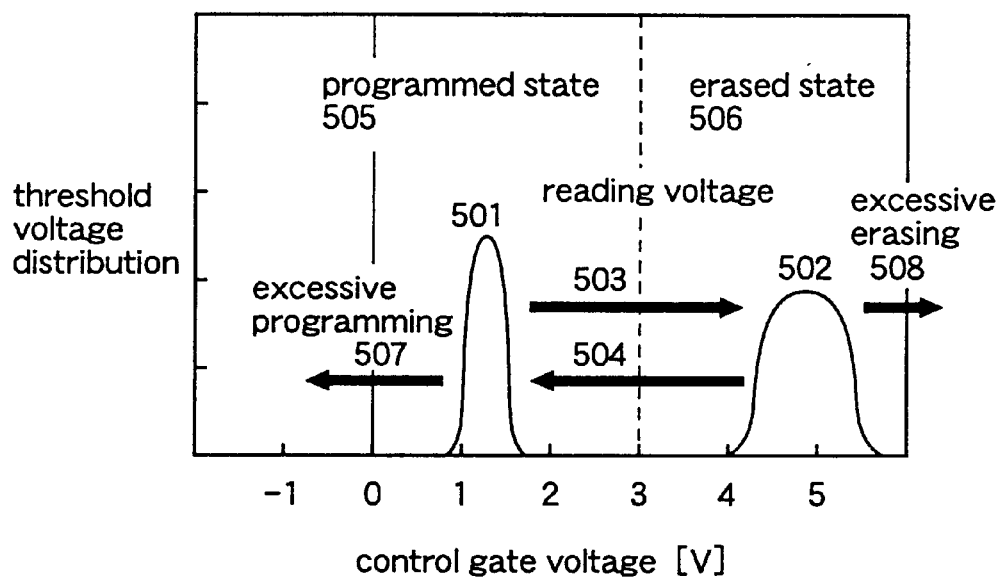
FIG. 18 is a diagram illustrating distribution of threshold voltages of memory cells, for explaining the operation of the semiconductor memory device according to the sixth embodiment.

FIG. 16 is a flowchart illustrating a sequence from setting of data in a column latch to completion of programming, in the nonvolatile memory device according to the sixth embodiment. FIG. 17 is a circuit diagram illustrating memory cells arranged in matrix. FIG. 18 is a diagram illustrating the distribution of threshold voltages of the memory cells.

As already described with respect to FIG. 2, in a NOR type memory cell employed in the present invention, the state where the threshold voltage is high (electrons are injected into the floating gate) is regarded as the erased state "0", while the state where the threshold voltage is low (electrons are drawn from the floating gate) is regarded as the programmed state "1". In the matrix of memory cells shown in FIG. 17, memory cells in the erased state and memory cells in the programmed state coexist. To be specific, there are a memory cell 501 which is always in the programmed state, a memory cell 502 which is always in the erased state, a memory cell 503 which is reprogrammable from the programmed state to the erased state, and a memory cell 504 which is reprogrammable from the erased state to the programmed state.

With reference to the threshold voltage distribution shown in FIG. 18, when programming to the memory cells is performed in the state where the cells in the erased state 506 and the cells in the programmed state 505 coexist, the threshold voltages of all the cells must be increased by once performing erasing. If reprogramming is performed without erasing, since the programming voltage is applied to the memory cell 501 which is already in the programmed state, the threshold voltage of the memory cell 501 further decreases, resulting in excessive programming 507. As the result of the excessive programming 507, the threshold voltage of the memory cell 501 becomes negative, and it flows a memory cell current when data is read even if the word line voltage is 0V when reading data, resulting in error reading.

Accordingly, in the flowchart of FIG. 16, erasing step 405 before programming step 408 is indispensable.

With respect to the memory cell 502 which is always in the erased state shown in FIG. 17, the data in the column latch is set to "L" in programming, so that programming is not performed. If the cycle of erasing and programming is repeated on such memory cell, only erasing is performed, and the threshold voltage of the memory cell gradually increases to reach the excessively erased state 508. If programming is performed in this state 508, since excessive electrons are injected into the floating gate, the electric field in the tunnel oxide film becomes high and the oxide film is damaged.

So, when programming to the memory cell 502 which is always in the erased state (see FIG. 18) is performed, program verity step 402 and preprogramming step 403 are inserted before the cycle of erasing and programming as shown in FIG. 16. Thereby, the memory cell in the erased state 506 goes into the programmed state 505, and this prevents the memory cell from going into the excessively erased state 508 in the subsequent erasing step.

In order to save the memory cell 501 which is always in the programmed state from excessive programming 507, erasing step 405 before programming is required. Further, in order to save the memory cell 502 which is always in the erased state from excessive erasing 508, preprogramming step 403 before erasing step 405 is required.

Hereinafter, the flow of the cyclic erasing and programming by the nonvolatile memory device according to the sixth embodiment will be described with reference to FIG. 16.

Initially, in latch data setting step 401, data of "H" is set in all the column latches. Next, in program verify step 402, the latches connected to the memory cells for which programming has been properly performed are reset to "L". In preprogramming step 403, only the memory cells connected to the latches set at "H" (i.e., memory cells in the erased state) are subjected to programming. The preprogramming step 403 and the program verify 404 are repeated by A times. These steps are repeated until the threshold voltages are set equally if a sufficient time for the cycle of erasing and programming can be secured. If a sufficient time cannot be secured, a programming pulse is given only one time by setting A=0. The flow from the latch data setting step 401 to the program verify step 404 is performed on all the memory cells in a block to be subjected to erasing (erasing block) by incrementing the address and switching the word line.

Next, erasing step 405 is carried out, and the threshold voltages of all the memory cells in the erasing block are increased.

In erasing verify step 406, it is decided whether the threshold voltages of the memory cells are proper or not. These steps 405 and 406 are repeated by B times until the threshold voltages of the memory cells are set equally. When the memory sells pass the erasing verify step 406, programming is performed.

In advance of programming step 408, data to be programmed is set in the column latches in latch data setting step 407. To be specific, "H" is set in the column latches connected to the memory cells to be subjected to programming while "L" is set in the column latches to be maintained in the erased state, followed by programming according to the manner described with respect to FIG. 4. In program verify step 409, it is decided whether the threshold voltages of the memory cells are proper or not. These steps 408 and 409 are repeated by C times until the programming step 408 to the memory cells is completed. When the programming step 408 for the selected word line is completed, the address is switched and the above-described flow from the latch data setting step 407 to the program verify step 409 is repeated on all the word lines erased.

When the programming step 408 for all the word lines erased is completed, programming is completed (step 410).

As described above, in the semiconductor memory device according to the sixth embodiment, in the cycle of erasing and programming, preprogramming is performed on only the memory cells in the erased state before performing erasing and then erasing is performed on all the memory cells and, thereafter, programming is performed on the memory cells. Therefore, it is possible to avoid excessive erasing 508 of the memory cells which are always in the erased state and excessive programming 507 of the memory tells which are always in the programmed state, whereby the threshold voltages of these memory cells can be set equally. As the result, error reading is avoided, and element destruction due to damage on the tunnel oxide film is avoided.

Embodiment 7

Hereinafter, a semiconductor memory device (nonvolatile memory device) according to a seventh embodiment of the present invention will be described with reference to the drawings.

Figure 19:
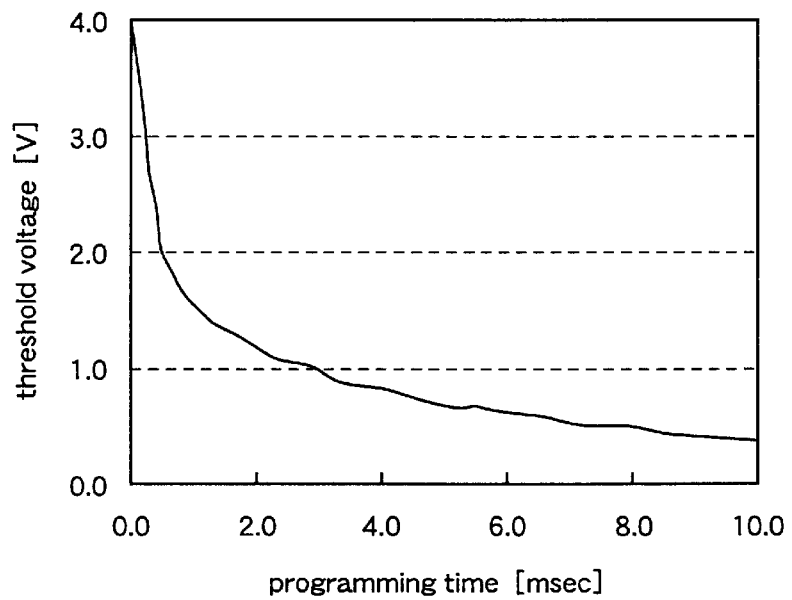
FIG. 19 is a diagram illustrating how the threshold voltage of the memory cell changes with the programming time, for explaining a semiconductor memory device (nonvolatile memory device) according to a seventh embodiment of the present invention.
Figure 20:
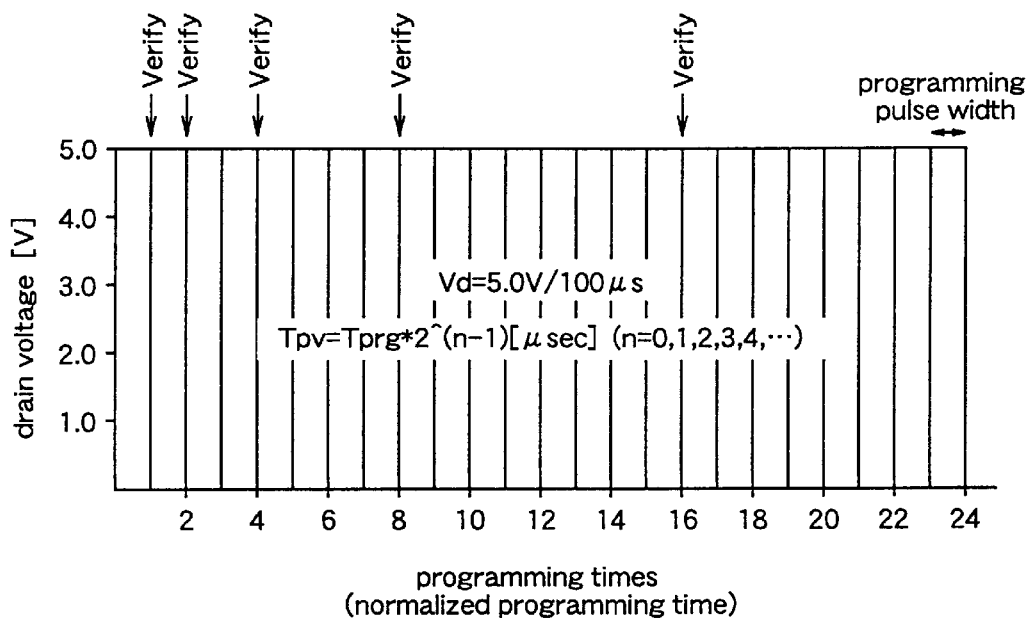
FIG. 20 is a diagram for explaining the timing to insert program verify, in the semiconductor memory device according to the seventh embodiment.

FIG. 19 is a diagram illustrating how the threshold voltage changes with the programming time. FIG. 20 is a diagram illustrating the timing at which program verify (Verify) is to be inserted, in the semiconductor memory device according to this second embodiment.

Generally, when data is programmed in a flash EEPROM, as soon as a programming pulse is applied, an electric field occurs in the tunnel oxide film and an FN tunnel current flows. As programming is continued, electrons accumulated in the floating gate are drawn from the drain side and so the electric field in the tunnel oxide film is reduced, whereby the profile of the threshold voltage gradually becomes gentle.

If a programming pulse of a predetermined width is repeatedly applied and program verify is performed each time the pulse is applied, the accumulated programming time including the program verify increases.

So, in this seventh embodiment, program verify is performed frequently in the initial stage of programming, and the frequency of program verify is gradually reduced as the threshold voltage approaches to the proper threshold voltage. Thereby, the accumulated (total) programming time can be reduced.

For example, assuming that a programming pulse of 100 $\mu$sec is repeatedly applied while gradually lowering the threshold voltage of the memory cell as shown in FIG. 20, program verify is inserted at the timing Tpv obtained as follows.

$Tpv = Tprg \times 2^{(n-1)}$ (n=1, 2, ... )

wherein Tpv is the time to insert program verify, Tprg is the programming pulse width (100 µsec), and n is the number of times of program verify.

To be specific, when 100 µsec has passed after starting programming, the first program verify is performed (n=1). When 200 µsec has passed after starting programming, the second program verify is performed (n=2). When 400 µsec has passed after starting programming, the third program verify is performed (n-3). In this way, as the number of times of programming increases and the threshold voltage approaches to the proper value, the frequency of insertion of program verify is decreased, whereby the total programming time can be reduced.

Although in this seventh embodiment insertion of program verify is represented as a function of the programming time, it may be represented as follows with the programming time being normalized.

$$Ppv=2^{(n-1)}$$

(n=1, 2, . . . )
wherein Ppv is the point where program verify is to be inserted, and n is the number of times of program verify. In this case, program verify is performed after the first, second, fourth, eighth, and sixteenth programming pulses are applied.

Embodiment 8

Hereinafter, a semiconductor memory device (nonvolatile memory device) according to an eighth embodiment of the present invention will be described with reference to the drawings.

Figure 21:
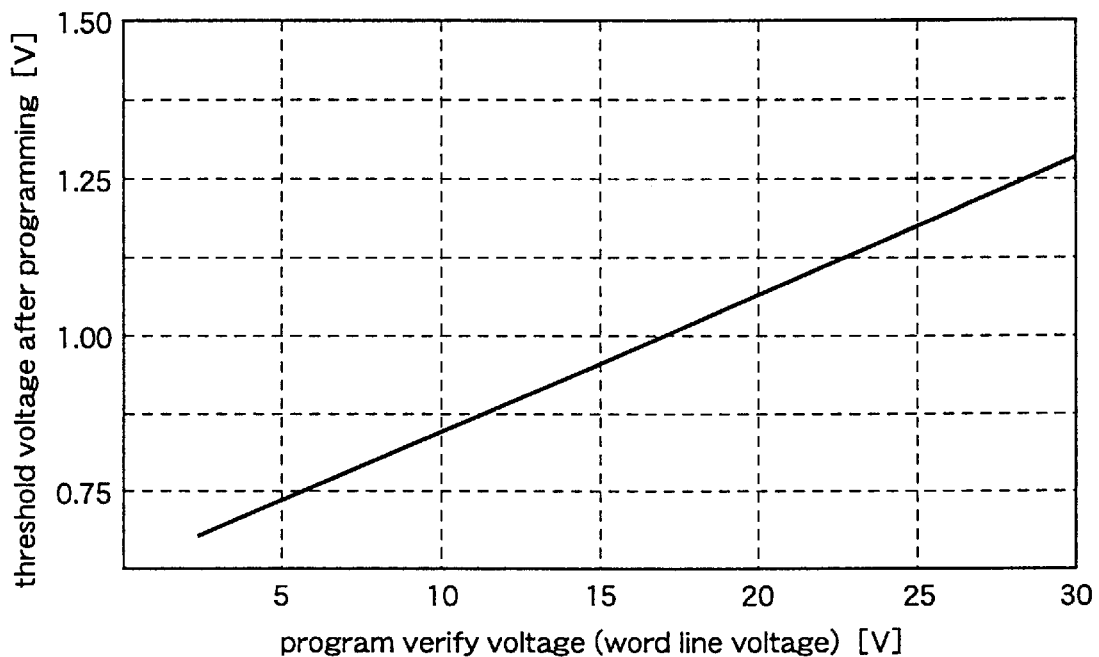
FIG. 21 is a diagram illustrating the relationship between the voltage at the word line during program verity and the threshold voltage after programming.

FIG. 21 is a diagram illustrating the relationship between the program verify voltage (word line voltage) and the threshold voltage after programming. As already described with respect to FIG. 4, in program verify, precharging is performed on the bit line BL0, and a program verify voltage of about 1V is applied to the word line WL0 to flow a very small memory cell current, whereby the bit line BL0 is discharged. If programming to the memory cell has been properly performed, the memory cell MEM0 flows a very small current (about 1 µA) to discharge the electric charge on the precharged hit line BT0. If programming has not been properly performed, the memory cell MEM0 flows no current, and the bit line BL0 holds the precharged voltage as it is. When the bit line BL0 is discharged, the bit line voltage detection circuit starts operation to reset the data stored in the latch.

As seen from FIG. 21, the voltage of the word line during program verify greatly affects the threshold voltage after programming. If the voltage at the word line WL0 is increased, larger memory cell current can be secured in program verify and, therefore, the bit line BL0 is discharged quickly and inversion of the latch is performed at an earlier timing. As the result, the threshold voltage of the memory cell MEM0 increases. On the other hand, if the voltage at the word line WL0 is lowered, the memory cell current in program verify decreases, and the threshold voltage decreases.

Since lower-voltage nonvolatile memories will be demanded in the future, the threshold voltage after programming must be reduced. However, since the voltage applied to the word line WL0 is limited, the threshold voltage in programming must be reduced by another method.

Figure 22:
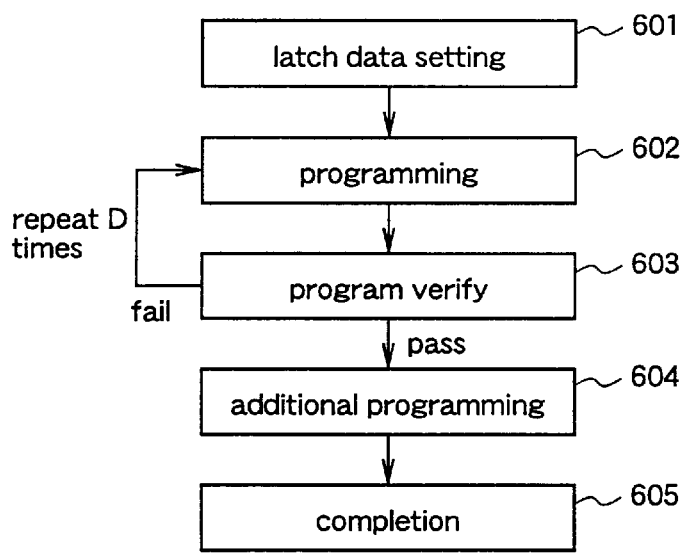
FIG. 22 is a flowchart for explaining additional programming in a semiconductor memory device (nonvolatile memory device) according to an eighth embodiment of the present invention.
Figure 23:
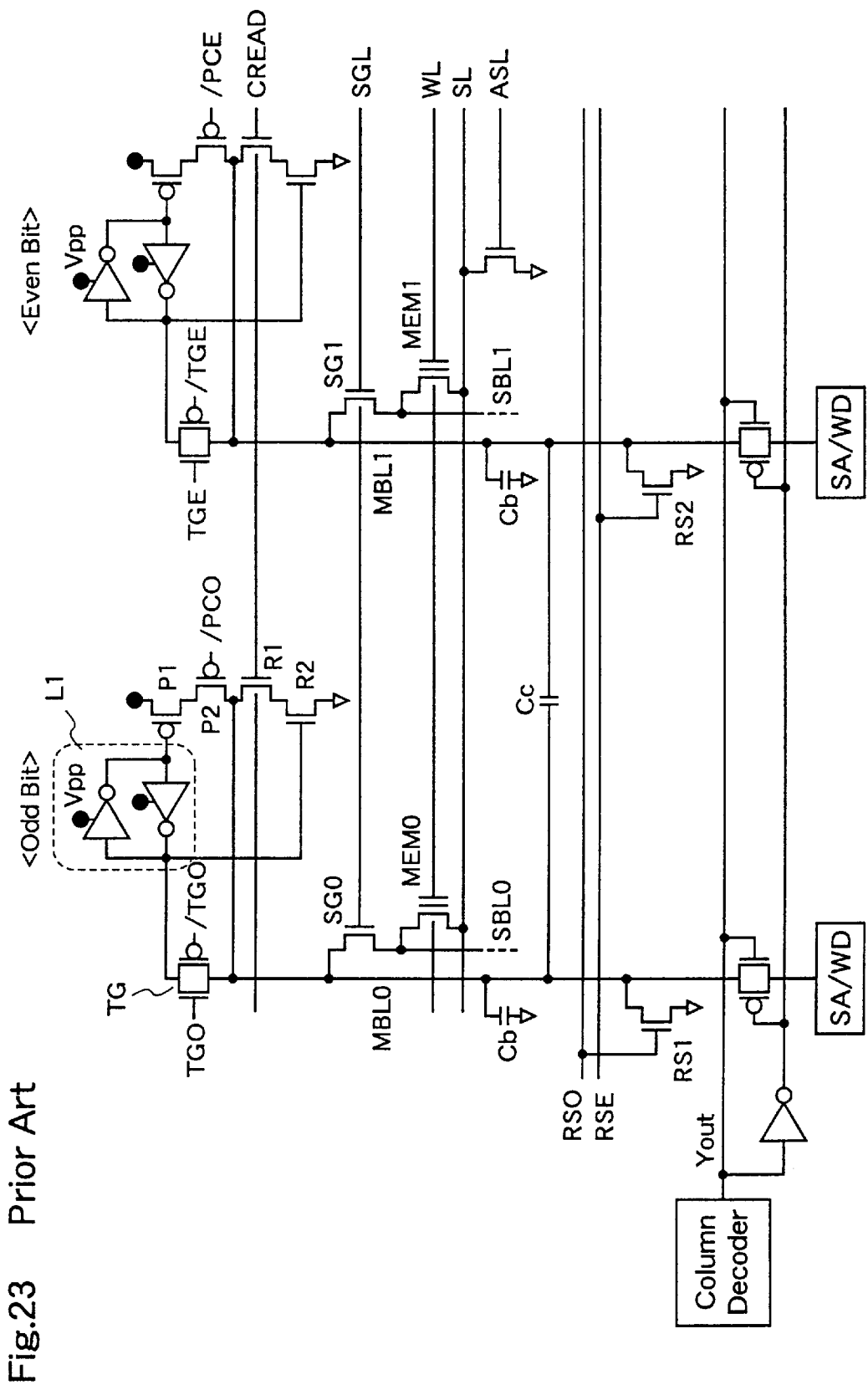
FIG. 23 is a circuit diagram illustrating a conventional column latch.

FIG. 22 is a flowchart for explaining programming by the semiconductor memory device according to the eighth embodiment.

With reference to FIG. 22, in advance of programming step 602, data to be programmed is set in the column latches in latch data setting step 601. To be specific, "H" is set in the column latches connected to the memory cells for which programming is to be performed, while "L" is set in the column latches connected to the memory cells which are to be maintained in the erased state, followed by programming in the same manner as described with respect to FIG. 4 (programming step 602). In program verify step 603, it is decided whether the threshold voltage of the memory cell after programming is proper or not. These steps 602 and 603 are repeated by D times until programming to the memory cell is completed.

When the memory cell has passed the program verify step 603, reprogramming (additional programming) is performed to reduce the threshold voltage of the memory cell. Since the threshold voltage of the memory cell is converged to about IV, the threshold voltage cannot be lowered with a short programming pulse as seen from FIG. 19. So, the additional programming step 604 is performed E times to reduce the threshold voltage. When the E times of additional programming steps 604 have been completed, programming is completed.

As described above, in the semiconductor memory device of this eighth embodiment, since additional programming is performed after the memory cell has passed program verify, the threshold voltage of the memory cell after programming can be lowered.

What is claimed is:

1. A semiconductor memory device, comprising:
    nonvolatile memory cells being arranged in a matrix;
    bit lines being connected to drains of said memory cells;
    latches, each of said latches being connected to a respective one of said bit lines or in a ratio of one latch to a number of said bit lines;
    transfer gates being operable to electrically separate said latches from said bit lines;
    bit line voltage detection circuits being operable to detect absolute voltages of said bit lines; and
    latch reset circuits being operable to invert data stored in said latches in accordance with outputs from said bit line voltage detection circuits.

2. A semiconductor memory device claimed in claim 1, further comprising:
    precharging means for precharging a bit line connected to a drain of a selected memory cell selected from said bit lines connected to the drains of said memory cells when performing program verify to decide whether programming of said memory cell has been properly performed;
    applying means for applying a program verify voltage to a word line of the selected memory cell during the program verify; and
    bit line voltage detecting means for detecting a bit line voltage which is determined by a cell current of the selected memory cell in the program verify, wherein each of said latch reset circuits is operable to invert the data stored in the respective one of said latches based on output from said bit line voltage detecting means.

3. A semiconductor memory device, comprising:
    nonvolatile memory cells being arranged in a matrix;
    bit lines being connected to drains of said memory cells;
    latches, each of said latches being connected to a respective one of said bit lines or in a ratio of one latch to a number of said bit lines;
    transfer gates being operable to electrically separate said latches from said bit lines;
    level shift circuits being operable to convert output levels of said latches to a program voltage and a verify drain voltage and further operable to output the program voltage and the verify drain voltage to said bit lines via said transfer gates;

bit line voltage detection circuits being operable to detect absolute voltages of said bit lines; and latch reset circuits being operable to invert data stored in said latches in accordance with outputs from said bit line voltage detection circuits.

4. A semiconductor memory device, comprising:

nonvolatile memory cells being arranged in a matrix;

bit lines being connected to drains of said memory cells;

latches being operable to store data, each of said latches being connected to a respective one of said bit lines or in a ratio of one latch to a number of said bit lines;

precharging means for precharging a bit line connected to a drain of a selected memory cell selected from said bit lines connected to the drains of said memory cells when performing program verify to decide whether programming of the selected memory cell has been properly performed, wherein the data stored in said latches are inverted according to voltages of said bit lines;

applying means for applying a program verify voltage to a word line of the selected memory cell in the program verify; and applying means for applying a negative voltage to word lines other than the word line of the selected memory cell.

5. A semiconductor device, comprising:

nonvolatile memory cells being arranged in a matrix;

bit lines being connected to drains of said memory cells;

latches, each of said latches being connected to a respective one of said bit lines or in a ratio of one latch to a number of said bit lines;

transfer gates being operable to electrically separate said latches from said bit lines;

bit line voltage detection circuits being operable to detect absolute voltages of said bit lines;

latch reset circuits being operable to invert data stored in said latches in accordance with outputs from said bit line voltage detection circuits; and verify pulse generation circuits being connected to said bit line voltage detection circuits and being operable to generate arbitrary pulse widths.

6. A semiconductor device claimed in claim 5, further comprising:

precharging means for precharging a bit line connected to a drain of a selected memory cell selected from said bit lines connected to the drains of said memory cells when performing program verify to decide whether programming of the selected memory cell has been properly performed;

applying means for applying a program verify voltage to a word line of the selected memory cell during the program verify;

setting means for setting word lines other than the word line of the selected memory cell to zero volts or a negative voltage;

executing means for executing program verify during a period of a verify pulse generated from said pulse generation circuits;

setting means for setting a low threshold voltage of the selected memory cell by setting a short pulse width of a programming pulse; and setting means for setting a high threshold voltage of the selected memory cell by setting a long pulse width of a programming pulse.

7. A semiconductor memory device, comprising:

nonvolatile memory cells being arranged in a matrix;

a regulator comprising:

generating means for generating a reference voltage, dividing means for dividing an output voltage into a first integer number (n−1) of stages using a second integer number (n) of resistive elements connected in series, wherein the second number is one integer greater than the first number, short-circuiting means for short-circuiting one of said resistive elements with an output section to create a divided voltage, wherein said one of said resistive elements is an integer number element (m) that is not larger than two integers less than the second integer number (n−2);

setting means for setting a resistance of the output section at an arbitrary value with said short-circuiting means, comparing means for comparing the divided voltage with the reference voltage, and output means for outputting a third number of stable voltages which are multiples of the reference voltage, wherein the third number is equal to the first number; and output means for outputting a first voltage to be applied to said nonvolatile memory cells when reading data, a second voltage to be applied to said nonvolatile memory cells programming data, and a third voltage to be applied to said nonvolatile memory cells when erasing data, by using said regulator.

8. A semiconductor memory device claimed in claim 7, further comprising:

bit lines being connected to drains of said nonvolatile memory cells;

latches, each of said latches being connected to a respective one of said bit lines or in a ratio of one latch to a number of said bit lines;

transfer gates being operable to electrically separate said latches from said bit lines;

bit line voltage detection circuits being operable to detect voltages of said bit lines;

latch reset circuits being operable to invert data stored in said latches in accordance with outputs from said bit line voltage detection circuits;

a booster circuit being operable to internally generate a high voltage to be applied to said regulator from a power supply voltage applied to said semiconductor memory device;

a decoder having a power supply and being operable to output a plurality of voltages, wherein an output of said regulator is connected to the power supply of said decoder.

9. A semiconductor memory device claimed in claim 7, further comprising:

bit lines being connected to drains of said nonvolatile memory cells;

latches, each of said latches being connected to a respective one of said bit lines or in a ratio of one latch to a number of said bit lines, wherein an output of said regulator is connected to a power supply for each of said latches and a plurality of voltages are output from each of said latches to the respective one of said bit lines;

transfer gates being operable to electrically separate said latches from said bit lines;

bit line voltage detection circuits being operable to detect voltages of said bit lines;

latch reset circuits being operable to invert data stored in said latches in accordance with outputs from said bit line voltage detection circuits; and a booster circuit being operable to internally generate a high voltage to be applied to said regulator from a power supply voltage applied to said semiconductor memory device.

10. A semiconductor memory device claimed in claim 7, further comprising:

bit lines being connected to drains of said nonvolatile memory cells;

latches, each one of said latches being connected to a respective one of said bit lines or in a ratio of one latch to a number of said bit lines;

transfer gates being operable to electrically separate said latches from said bit lines;

bit line voltage detection circuits being operable to detect voltages of said bit lines;

latch reset circuits being operable to invert data stored in said latches in accordance with outputs from said bit line voltage detection circuits;

level shift circuits being operable to convert output levels of said latches to a program voltage and a verify drain voltage, wherein an output of said regulator is connected to a power supply for each of said level shift circuits, and plural kinds of voltages are supplied from said latches through said level shift circuits to said bit lines; and a booster circuit being operable to internally generate a high voltage to be applied to said regulator from a power supply voltage applied to said semiconductor memory device.

11. A semiconductor device, comprising:

nonvolatile memory cells being arranged in a matrix;

bit lines being connected to drains of said memory cells;

flip-flops, each said flip-flop being provided for a respective one of said bit lines or in a ratio of one flip-flop to a number of said bit lines;

shift registers, each said shift register being constructed by connecting two adjacent flip-flops such that a data input terminal of one of the flip-flops is connected to a data output terminal of another of the flip-flops;

transfer gates being operable to electrically separate said flip-flops from said bit lines;

bit line voltage detection circuits being operable to detect absolute voltages of said bit lines;

flip-flop reset circuits being operable to invert data stored in said flip-flops in accordance with outputs from said bit line voltage detection circuits; and setting means for setting data to be programmed by serially inputting data to said shift registers.

12. A semiconductor device, comprising:

nonvolatile memory cells being arranged in a matrix;

bit lines being connected to drains of said memory cells;

flip-flops, each of said flop-flops being provided for a respective one of said bit lines or in a ratio of one flip-flop to a number of said bit lines;

shift registers, each of said shift registers being constructed as connecting two adjacent flip-flops such that a data input terminal of one of the flip-flops is connected to a data output terminal of another of the flip-flops;

transfer gates being operable to electrically separate said flip-flops from said bit lines;

level shift circuits being operable to convert output levels of said flip-flops to a program voltage and a verify drain voltage and further operable to output the program voltage and the verify drain voltage to said bit lines via said transfer gates;

bit line voltage detection circuits being operable to detect absolute voltages of said bit lines;

flip-flop reset circuits being operable to invert data stored in said flip-flops in accordance with outputs from said bit line voltage detection circuits; and setting means for setting data to be programmed by serially inputting data to said shift registers.

13. A semiconductor memory device, comprising:

nonvolatile memory cells being arranged in a matrix;

word lines being connected to control gates of said nonvolatile memory cells;

bit lines being connected to drains of said nonvolatile memory cells;

source lines being connected to sources of said nonvolatile memory cells;

latches, each of said latches being connected to a respective one of said bit lines or in a ratio of one latch to a number of said bit lines; and a control circuit operable to perform an erasing operation on said nonvolatile memory cells in advance of performing a programming operation on said nonvolatile memory cells and further operable to perform a pre-programming for setting a memory cell in an erased state to a programed state prior to the erasing operation performed in advance of the programming operation.

14. A semiconductor memory device, comprising:

nonvolatile memory cells being arranged in a matrix;

performing means for performing a program verify of a memory cell of said nonvolatile memory cells after programming has been performed to decide if the programming has been properly performed;

performing means for performing reprogramming to the memory cell when the result of the program verify is failure;

reducing means for arbitrarily reducing a number of times the program verify is performed as a number of times of programming increases; and performing means for performing programming continuously when a number of times programming is performed decreases.

15. A semiconductor memory device claimed in claim 14, wherein when said semiconductor memory device is performing the programming and the program verify to the memory cell in a sequence to execute the program verify after the programming, assuming that a predetermined pulse width is Tpreg, the number of times of program verify is n, and an elapse time Tpv from the start of the programming, the elapse time corresponding to a timing at which the program verify is to be performed, said semiconductor memory device is operable to perform the program verify with a timing that satisfies the following relationship:

$$Tpv = Tpreg \times 2^{(n-1)}$$

(n=1, 2, . . . ).

16. A semiconductor memory device claimed in claim 14, wherein when said semiconductor memory device is performing the programming and the program verify to the memory cell in a sequence to execute the program verify after the programming, assuming that a number of times of program verify is n, a verify point Ppv which indicates the number of time of programming after which the program verify is to be performed corresponding to a timing at which the program verify is to be performed, said semiconductor memory device is operable to perform the program verify with a timing that satisfies the following relationship:

$$Ppv = 2^{\wedge}(n-1)$$

(n=1, 2, ... ).

17. A semiconductor memory device, comprising:

nonvolatile memory cells being arranged in a matrix;

bit lines being connected to drains of said nonvolatile memory cells;

latches, each of said latches being connected to a respective one of said bit lines or in a ratio of one latch to a number of said bit lines;

transfer gates being operable to electrically separate said latches from said bit lines;

selecting means for selecting a bit line for programming in accordance data stored in said latches connected to said bit lines;

performing means for performing program verify to decide whether programming has been properly performed;

performing means for performing the program verify after the programming has been performed; and performing means for performing additional programming by adding a programming pulse when a result of the program verify indicates that the programming has been properly performed.

* * * * *